United States Patent [19]

Takahashi et al.

[11] Patent Number: 4,991,139
[45] Date of Patent: Feb. 5, 1991

[54] SEMICONDUCTOR MEMORY DEVICE

[75] Inventors: Yasushi Takahashi, Tachikawa; Masamichi Ishihara, Hamura; Kazuhiko Kajigaya, Ohme; Toshiyuki Sakuta, Hamura, all of Japan

[73] Assignee: Hitachi, Ltd., Tokyo, Japan

[21] Appl. No.: 228,022

[22] Filed: Aug. 4, 1988

[30] Foreign Application Priority Data

Aug. 7, 1987 [JP] Japan ................... 61-196203
Aug. 25, 1987 [JP] Japan ................... 62-211185
Oct. 19, 1987 [JP] Japan ................... 62-263495

[51] Int. Cl.$^5$ ................ B11C 29/00; G06F 11/22
[52] U.S. Cl. ................ 365/201; 365/149; 371/21.1
[58] Field of Search .......... 365/190, 200, 201, 149; 371/21, 21.1, 21.2

[56] References Cited

U.S. PATENT DOCUMENTS

| 4,138,740 | 2/1979 | Itoh | 365/203 |
| 4,654,849 | 3/1987 | White, Jr. et al. | 371/21 |
| 4,686,456 | 8/1987 | Furuyama et al. | 371/21 X |
| 4,811,299 | 3/1989 | Miyazawa et al. | 365/201 |
| 4,916,700 | 4/1990 | Ito et al. | 371/21.1 |

Primary Examiner—Joseph A. Popek
Attorney, Agent, or Firm—Antonelli, Terry, Stout & Kraus

[57] ABSTRACT

A semiconductor memory device is provided which includes a plurality of data lines coupled to memory cells and to a detecting arrangement for detecting if logical levels of each of the data lines coincide to each other or not. A test read arrangement is also provided which stores the same information, in advance, in plural memory cells so that if there is a defect in one of the memory cells, this can be detected by the detecting arrangement.

12 Claims, 11 Drawing Sheets

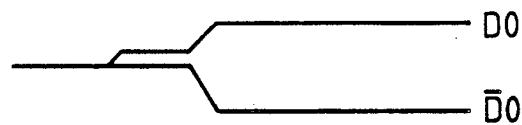
FIG. 13(a)
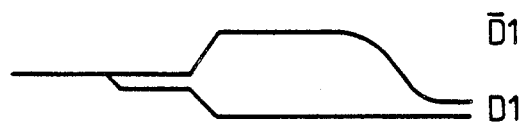
FIG. 13(b)
FIG. 13(c)
FIG. 13(d)
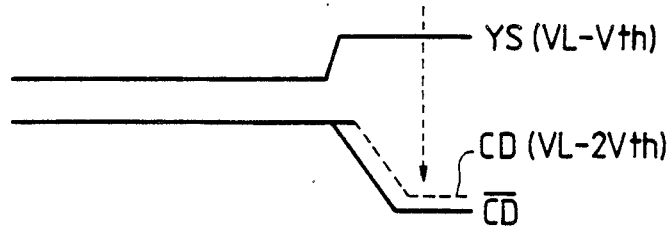
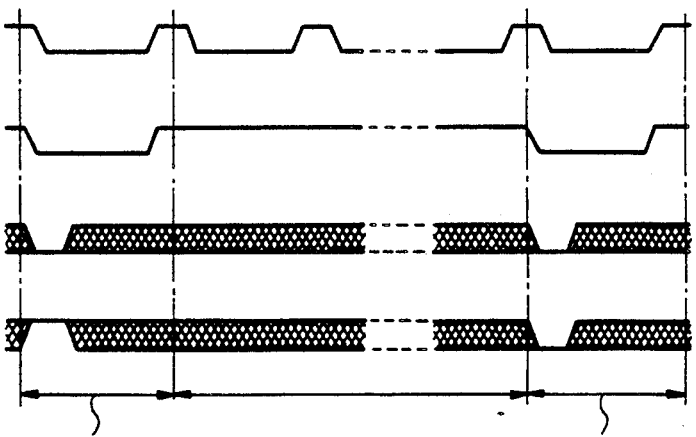
FIG. 14(a) $\overline{RAS}$
FIG. 14(b) $\overline{CAS}$
FIG. 14(c) $\overline{WE}$
FIG. 14(d) A0, A1
MODE SETTING CYCLE FOR SETTING A TEST MODE
MODE SETTING CYCLE FOR RELEASING THE TEST MODE

SEMICONDUCTOR MEMORY DEVICE

BACKGROUND OF THE INVENTION

This invention relates to a semiconductor memory device and its testing technology, and more particularly to a technology which is effective, for example, when applied to test a dynamic random access memory (hereinafter called as DRAM or a dynamic type RAM).

In the course of recent developments in semiconductor technology, DRAMs having a large memory capacity such as about 1M bit have been developed. As memory capacity is increased, testing time for the memory is correspondingly increased. Therefore, it has been proposed to provide a DRAM in which a testing circuit is arranged within the DRAM. In the proposed system, similar signals are already written in its memory array with a unit of x4 bits, and an external output terminal becomes a high impedance if any one bit of x4 bits signal read out of the memory array does not coincide with the remaining signals. In this case, if all the reading signals of x4 bits are in a high level or a low level, either a high level signal or a low level signal is outputted from the output terminal. (See "Mitsubishi Technical Bulletin" published in 1985, Vol. 59, No. 9 of Mitsubishi Corporation.)

In the above-mentioned DRAM, only about 4 bits are tested simultaneously. Due to this fact, this arrangement is less effective for a large memory capacity exceeding 1M bits. In order to expand this concept, it can be attempted to increase the number of bits to be tested simultaneously. However, this may result in increasing the number of peripheral circuits (such as I/O lines or a maintenance amplifier etc.) and also in increasing the chip size. In addition, even if the above-mentioned increase of the chip size is ignored, it may be assumed that about 16 bits or 32 bits are an upper limit of the number of the bits. Further, in the case of the above-described system in which the sensed outputs, under their non-coincidence condition, become a high impedance, there is no effective sensing means which may be applied when a DRAM is mounted in a printed circuit board etc. Due to this fact, this is not appropriate for a memory testing under its normal condition of application.

SUMMARY OF THE INVENTION

It is an object of the present invention to provide a dynamic RAM in which high-speed testing is realized.

It is another object of the present invention to provide a high-speed dynamic RAM.

It is still another object of the present invention to provide a dynamic RAM having a testing function which is suitable for a high-speed dynamic RAM.

The above and other objects and a new feature of the present invention will become apparent from the following description and the accompanying drawings.

A summary of a typical invention disclosed in the present invention will be described in brief as follows. That is, MOSFETs are provided which have to which gates supplied with signals of complimentary data lines (or bit lines) and which have memory cells connected thereto. A coincidence/non-coincidence circuit is provided to output a coincidence/non-coincidence of level in the corresponding data lines in reference to drain output signals of the MOSFETs. According to the above-described means, the corresponding complimentary data lines may provide the same reading signals by storing the same information in advance. Therefore, if there is present a memory cell storing even one erroneous bit of information, it becomes possible to detect it by the coincidence/non-coincidence circuit, resulting in that a simultaneous reading test of multi-bits becomes possible.

According to another preferred embodiment disclosed in the present invention, there is provided a circuit for making a relative short-circuited condition of a plurality of complimentary data lines to which the memory cell is connected after a detecting amplifier starts to operate under a designation of the desired operation mode. According to this means, since the complimentary data lines to which the memory cells storing the same information in advance are connected to each other, if there is only one memory cell storing erroneous information, an electric current flows in the detecting amplifier for amplifying the reading signal of complimentary data lines, and the passing current is measured or the equal signal levels in the common complimentary data line to which the above-described complimentary data line is connected is detected, whereby a reading test for multi-bits of information becomes possible.

BRIEF DESCRIPTION OF THE DRAWINGS

FIGS. 13(a) to 13(d) are a waveform diagram for illustrating an operation of a reading test of the sixth preferred embodiment.

FIGS. 14(a) to 14(d) are a waveform diagram for illustrating a test mode.

DESCRIPTION OF THE PREFERRED EMBODIMENTS

Figure 1:
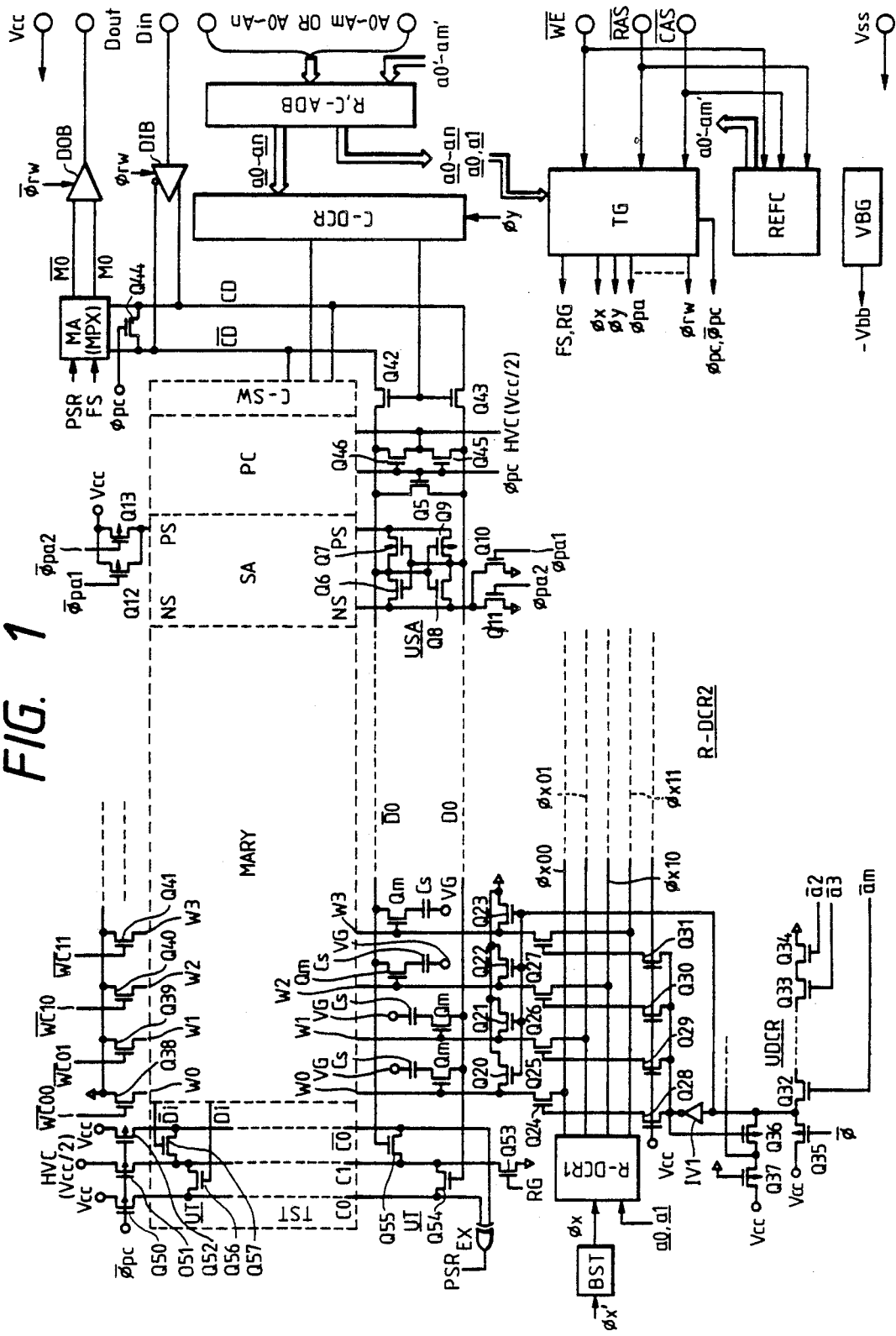
FIG. 1 is a circuit diagram for showing the first preferred embodiment of a dynamic RAM of the present invention.

In FIG. 1 is illustrated a schematic circuit diagram of one preferred embodiment of a dynamic RAM of the present invention. Each of the circuit elements in this figure is formed on a semiconductor substrate such as one mono-crystal silicon by a manufacturing technology for a well-known CMOS integrated circuit. In this figure, MOSFET indicated by an arrow at a channel part (Back gate) is a P-channel type MOSFET.

Although not particularly limited, the integrated circuit is formed on a semiconductor substrate composed of a mono-crystalline P-type silicon. N-channel MOSFET is composed of a source region, a drain region formed in a surface of the semiconductor substrate and a poly-silicon layer formed in the surface of the semiconductor substrate between the source region and the drain region through a thin gate insulative film. P-channel MOSFET is formed in N-type well region formed on the surface of the semiconductor substrate. With this arrangement, the semiconductor substrate may constitute a common substrate for a plurality of N-channel MOSFETs formed thereon. The N-type well region may constitute the substrate gate of P-channel MOSFET formed thereon. The substrate gate or N-type well region of the P-channel MOSFET is connected to a power supply external terminal Vcc shown in FIG. 1. A substrate bias voltage generating circuit VBC may generate a negative back-bias voltage-Vbb to be supplied to the semiconductor substrate. With this arrangement, a back bias voltage is applied to the substrate gate of N-channel MOSFET, resulting in that a parasitic capacity value between the source and drain of the N-channel MOSFET is decreased, a highspeed operation of the circuit is attained, a minority carrier (less number) carrier generated in the substrate is absorbed and a loss of information charge accumulated in an information memory capacitor is reduced, so that a refreshing period can be extended.

A more concrete structure of the integrated circuit will roughly described as follows.

That is, a relatively thick field insulative film formed by a well-known selective oxidation process is formed in an area of the surface of the semiconductor substrate composed of a mono-crystalline P-type silicon and formed with N-type well region, other than the surface portion of active region, in other words, other then a semiconductor wiring area, a capacitor forming area, sources, drains and channel forming regions (gate forming region) of N-channel and P-channel MOSFETs. Although not particularly limited, a first poly-silicon layer is formed on the capacitor forming area through a relatively thick insulative film (oxidation film). The first poly-silicon layer is extended onto the field insulative film. The surface of the first poly-silicon layer is formed with a thin oxidation film formed by its thermal oxidation. The surface of the semiconductor substrate in the capacitor forming area is formed with a channel under a formation of the N-type region via an ion implantation process or a supplying of the desired voltage. With this arrangement, a capacitor composed of the first poly-silicon layer, a thin insulative film and a channel region is formed. The first poly-silicon layer on the field oxidation film is deemed as a kind of wiring.

On the channel forming region is formed a second poly-silicon layer for forming a gate electrode through a thin gate oxidation film This second poly-silicon layer is extended onto the filed insulative film and the first poly-silicon layer Although not particularly limited, word lines and dummy word lines in a memory array to be described later are composed of the second poly-silicon layer.

The surface of the active region not covered by the field insulative film, the first and second poly-silicon layers is formed with a source region, a drain region and a semiconductor wiring region by a well-known impurities implanting technology using these regions as an impurities implanting mask.

The surface of the semiconductor substrate including the first and second poly-silicon layers is formed with an inter-layer insulative film having a relative high thickness, and on this inter-layer insulative film is formed a conductive layer composed of aluminum. The conductive layer is electrically connected to the poly-silicon layer and the semiconductor layer through contact holes formed in the insulative film formed therebelow. Data lines in the memory array to be described later, although not particularly limited, are composed of conductor layers extended onto the inter-layer insulative film.

The surface of the semiconductor substrate including the inter-layer insulative film and the conductor layer is covered by a final passivation film composed of a silicon nitride film and a phosphor silicate glass film.

Although not particularly limited, a memory array MARY is of a two-crossing point (back-to-back bit line) system. In FIG. 1 are illustrated concretely a pair of lines. To a pair of complementary data lines (bit lines or digit lines) D0 and D0 in parallel and illustrated for example is arranged and connected each of I/O nodes of a plurality of memories composed of an address selective MOSFETQm and an information memory capacitor Cs with a desired regularity shown in the figure.

A pre-charge circuit PC is composed of a switch MOSFET arranged between the complementary data lines D0 and D0 such as MOSFET Q5 indicated as its representative example. To MOSFET Q5 is supplied a pre-charge signal $\phi pc$ at its gate generated under a chip non-selective condition. With this arrangement, the above-described FET Q5 is turned on under a non-selective chip condition or a memory cell selective condition. Thus, in the previous operating cycle, the high level and low level of the complementary data lines D0 and D0 under an amplification operation of a detecting amplifier (sense amplifier) SA to be described later are short circuited and each of the complementary data lines D0 and D0 is applied with a pre-charge voltage of about Vcc/2 (HVC). Although not particularly limited, in case that this chip is left under a non-selective condition for a relative long period of time, the above-described pre-charged level is decreased by a leak current and the like. Thus, in the preferred embodiment, switches MOSFET Q45 and Q46 are provided to supply a half pre-charge voltage HVC. A practical circuit of a voltage generating circuit for forming this half pre-charge voltage HVC is made such that it may have only a relative low current supplying feature to accommodate for the above-mentioned leak current. With this arrangement, a consumption power is prevented from being increased.

The above-mentioned detecting amplifier SA is made non-operative condition by the chip non-selective condition of RAM chips before the above pre-charged MOSFETQ5 and the like are turned on. With this arrangement, the above complementary data lines D0 and D0 hold the high level and low level under a high-impedance condition. As RAM is made operative, the above precharged MOSFET Q5, Q45 and Q46 and the like are turned off before the detecting amplifier SA is made operative. With this arrangement, the complementary data lines D0 and D0 hold the above half pre-charged level under a high impedance condition.

Since in this type of the half pre-charge system described above, both high level and low level of the complementary data lines D0 and D0 are merely formed in their chort-circuited condition, a low power saving can be saved. In an amplifying operation of the detecting amplifier SA, the above complementary data lines D0 and D0 are varied between the high level and the low level around the above pre-charge level. With this arrangement, it is possible to decrease a noise level generated in the complementary data lines D0 and D0 through a capacitive coupling.

The detecting amplifier SA is composed of a plurality of unit detecting circuits. In this figure is illustrated one unit circuit USA. This unit circuit is composed of CMOS latch circuit composed of P-channel MOSFET Q7 and Q9 and N-channel MOSFET Q6 and Q8. A pair of I/O nodes are connected to the above complementary data lines D0 and D0. Although not particularly limited, to the above latch circuit is supplied a power supply voltage Vcc through parallel connected P-channel MOSFET Q12 and Q13 and then a ground voltage Vss of the circuit is supplied through the parallel connected N-channel MOSFET Q10 and Q11. These power switches MOSFET Q10, Q11 and MOSFET Q12 and Q13 are commonly applied for the latch circuit (unit circuit) arranged in other similar lines within the same memory array. In other words, each of P-channel MOSFET and N-channel is connected in common at its source lines PS and SW.

To the gates of the above MOSFET Q10 and Q12 are applied, under an operating cycle, complementary timing pulses $\phi pa1$ and $\phi pac1$ for use in activating the detecting amplifier SA, and to the gates of MOSFET Q11 and Q13 are applied complementary timing pulses $\phi pa2$ and $\phi pa2$ which are delayed than the above timing pulses $\phi pa1$ and $\phi pa1$. With this arrangement, operation of the detecting amplifier SA is divided into two steps. When the timing pulses $\phi pa1$ and $\phi pa1$ are generated, that is, in the first stage, a minute reading voltage applied between a pair of data lines from the memory cell under an electric current limiting action made by MOSFET Q10 and Q12 having a relative low conductance is increased without being influenced by a non-desired level variation. After a difference of the complementary data potentials is increased more under this amplifying operation, the timing pulses $\phi pa2$ and $\phi pa2$ are generated, i.e. the second stage operation is performed, resulting in that MOSFET Q11 and Q13 having a relative high conductance are turned on. An amplifying operation of the detecting amplifier SA is made fast by turning on MOSFET Q11 and Q13. The amplifying operation of the detecting amplifier SA is performed under two separate stages, thereby an undesired level variation of the complementary data lines can be prevented and thus a high speed data reading can be performed.

Although not particularly limited, a row decoder R-DCR is composed of a combination of two-divided low decoders R-DCR1 and R-DCR2. In order to simplify the figure, one circuit of the second row decoder R-DCR2 (four word lines) is illustrated as its representative example. According to the constitution shown in this figure, although not particularly limited, address signals $\overline{a2}$ to $\overline{am}$ are supplied to the gates of N-channel type driving MOSFET Q32 to Q34 connected in series. To the gate of P-channel type load MOSFET Q35 is supplied one shot pulse $\phi$ made temporarily low level during this operation. This one-shot pulse $\phi$ is kept at a low level while a low address strobe signal $\overline{RAS}$, for example, is varied from its high level (Vcc) to its low level (Vss), thereby an operating timing signal of the low address buffer R-ADB is formed and is kept at a low level until a word line selective timing signal $\phi x$ is generated. Therefore, the above one shot pulse $\phi$ is formed by a logic circuit (not shown) receiving these timing signals. NAND gate circuit is composed of the above load MOSFET Q35 and driving MOSFET Q32 to Q34 and the above four word line selective signals are formed. An output from the above NAND gate circuit is, in turn, inverted by CMOS inverter IV1 and transmitted to the gates of N-channel type transmitting gates MOSFET Q24 to Q27 acting as switching circuit through N-channel type cut MOSFET Q28 to Q31. Since the above NAND gate circuit performs by itself a dynamic operation, a subsequent latch circuit is added. An output signal from CMOS inverter circuit IV1 transmitting the above output signal is fed back to a gate of P-channel type load MOSFET Q36 connected in parallel with the above load MOSFET Q35 in the other hand. With this arrangement, when an output signal from the above NAND gate circuit is made high in its level, the above second load MOSFET Q36 is turned on under a low level of an output signal from CMOS inverter circuit IV1 and the output signal is kept at its high level. If the output signals from the above NAND gate circuit are all in low level, in other words, if all the driving MOSFET Q32 to Q34 are turned on under the high levels of all the address signals $\overline{a2}$ to $\overline{am}$, the load MOSFET Q36 is turned off under a high level output signal from the above CMOS inverter circuit IV1. With this arrangement, in the above NAND gate circuit, after one shot pulse $\phi$ is made to its high level, a DC current is not consumed through the above turned-on driving MOSFET Q32 to Q34. The above second row decoder R-DCR2 may be a complete CMOS static type decoder in place of the above-described arrangement.

Although a practical circuit diagram of the first row decoder R-DCR1 is not illustrated, four types of word line selective timing signals $\phi x00$ to $\phi x11$ are formed from a word line selective timing signal $\phi x$ through a switch circuit composed of the above similar transmitting gate MOSFET and the cut MOSFET selected by the decode signal formed by decoding the complementary address of two bits (meaning a0, $\overline{a0}$, a1, $\overline{a1}$. These word line selective timing signals $\phi x00$ to $\phi x11$ are transmitted to each of the word lines through the above transmitting gates MOSFET Q24 to Q27. Although not particularly limited, the row decoder R-DCR1 may be one in which one shot pulse $\phi$ is received in the same manner as that of the low decoder R-DCR2 to perform a word line selective operation and also it may be a complete CMOS static type decoder in the manner as described above.

Although not particularly limited, a timing signal $\phi x00$ is made as a high level in synchronous with the timing signal $\phi x$ when the address signals a0 and a1 are at their low levels. Similarly, each of the timing signals $\phi x01$, $\phi x10$ and $\phi x11$ is made as a low level in synchronous with the timing signal $\phi x$ when the address signals $\overline{a0}$ and a1, a0 and $\overline{a1}$, and $\overline{a}$ and $\overline{a1}$ are made as their low levels.

With this arrangement, the address signals a1 and $\overline{a1}$ are deemed as a kind of word line group selective signal for use in designating a group of word lines corresponding to memory cells connected to data lines D of a plurality of word lines (called as W0, W1 and a first group of word lines) and a group of word lines corresponding to the memory cells connected to the data lines $\overline{D}$ (called as W2, W3 and a group of second word lines).

It is possible to align a pitch (a spacing) of a row decoder R-DCR2 with a pitch of the word lines by diving such low decoders into two such as a low decoder R-DCR1 and R-DCR2. As a result, no useless spacing is generated on the semiconductor substrate. MOSFET Q20 to Q23 are arranged between each of the word lines and the ground potential and then an output from the above NAND circuit is applied to the gate. Although not particularly limited, to the above word lines at their extremity ends (ends opposite to the side where the decoder is arranged) are arranged switches MOSFET Q38 and Q41. To the gates of these MOSFET Q38 to Q41 are supplied timing signals $\overline{WC00}$ to $\overline{WC11}$ having phases opposite to those of the above timing signals $\phi x00$ to $\phi x11$. Since non-selective word lines can be fixed to the ground potential of the circuit, it is possible to prevent the non-selective word lines from being raised up to their intermediate potential under a capacitive coupling between the word lines in response to the raising-up of the selective word lines.

A column switch C-SW selectively connects the complementary data lines CD and $\overline{CD}$ which are common to the complementary data lines D0 and $\overline{D0}$ as indicated in N-channel MOSFET Q42 and Q43 represented as its example. To the gates of these MOSFET Q42 and Q43 is supplied a selective signal from the column decoder C-DCR to be described later.

The row address buffer R-ADB is made operative by a timing signal (not shown) formed by a timing signal generating circuit TG to be described later in response to a row address strobe $\overline{RAS}$ supplied from an external terminal, takes the external address signals A0 to Am supplied from the external terminals in synchronous with the above row address strobe signal $\overline{RAS}$ under its operating condition, holds them and forms the internal complementary address signals a0 to am to transmit them to the above row address decoders R-DCR1 and R-DCR2. In this case, an internal address signal a0 having the same phase as that of the external address signal A0 supplied from the above external terminal and another internal address signal a0 having an opposite phase to that of the external address signal are combined to express the complementary signal a0 (similarly expressed in the following description). The row address decoders R-DCR1 and R-DCR2 may interpret the above complementary address signals a0 to am as described above, and perform a word line selection in synchronous with the word line selective timing signal $\phi x$.

In turn, the column address buffer C-ADB is made operative by a timing signal (not shown) to be described in reference to a column address strobe signal $\overline{CAS}$ supplied from the external terminal, takes, under its operative condition, the external address signals A0 to An supplied from the external terminals in synchronous with the above column address strobe signal $\overline{CAS}$, holds them and at the same time forms the internal complementary address signals a0 to an to transmit them to the column decoder C-DCR.

The column decoder C-DCR is composed basically of an address decoder circuit similar to the above address decoder R-DCR2. It interprets the complementary address signals a0 to an supplied from the column address buffer C-ADB, and forms a selective signal to be supplied to the above column switch C-SW in synchronous with a data line selective timing signal $\phi y$.

In this figure, the row address buffer R-ADB and the column address buffer C-ADB are expressed as the address buffers R and C-ADB, together.

Between the above common complementary data lines CD and $\overline{CD}$ is arranged a N-channel type precharge MOSFET Q44 which composes the precharging circuit similar to the above. To the common complementary data lines CD and $\overline{CD}$ are connected a pair of I/O nodes for a main amplifier having a constitution similar to that of the above unit detecting amplifier USA. To the output part of the above main amplifier MA is arranged a multiplexer (MPX) circuit. This multiplexer (MPX) may receive an output signal of the above main amplifier MA and a test reading-out signal and selectively output them. Output nodes MO and $\overline{MO}$ of this main amplifier MA including this multiplexer are connected to an external terminal Dout through the data output buffer DOB. Under a normal operation and the reading-out operation, the data output buffer DOB is made operative with a timing signal $\phi rw$, an output signal of the main amplifier MA made operative under this condition is amplified and then outputted from the external terminal Dout. If it is in a test mode to be described later, the multiplexer MPX is changed over and an output signal PSR of the coincidence/non-coincidence circuit EX to be described later is outputted from the external terminal Dout through a data output buffer DOB. Under a normal operating mode and a writing operation, an output of the data output buffer DOB (Dout) is made as a high impedance condition with the above timing signal $\phi rw$.

The above complementary data lines CD and $\overline{CD}$ are connected to an output terminal of the data input buffer DIB. If it is a writing operation, the data input buffer DIB is made operative by a timing signal $\phi rw$ and a complementary writing signal is transmitted to the above common complementary data lines CD and $\overline{CD}$ which corresponds to a writing signal supplied from the external terminal Din. With this arrangement, a writing operation for the selective memory cell is performed. If it is a reading-out operation, an output from the data input buffer DIB is made to have a high impedance condition with the above timing signal $\phi rw$. Although not particularly limited, in order to correspond to the reading-out test to be described later, the above data input buffer DIB is made to have a high electric current capacity capable of making a simultaneous driving of a plurality of complementary data lines. That is, the complementary data lines are selected under multiple operation to cause a plurality of complementary data lines to be selected simultaneously, thereby the complementary data lines are connected to the above complementary data lines CD and $\overline{CD}$. With this arrangement, a function is added to enable a substantial simultaneous writing of the same writing signal in a plurality of memory cells connected to one selected one word line. In order to realize this function, although not shown in the figure, the column decoder C-DCR is constructed such that it may form a selection signal to cause all the column switches to be turned on in response to the desired control signal. As regards the details of the simultaneous writing function, the technology disclosed in the previous application of the present applicant (Jap. Pat. Appln. No. 60-199418) can be utilized.

As described above, during a writing operation for a dynamic type memory cell composed of the above-described address selecting MOSFET Qm and an information storing capacitor Cs, in order to make a full writing for the information storing capacitor Cs, in other words, in order to prevent a loss of level in the writing high level for the information storing capacitor Cs with a threshold voltage value of an address selecting MOSFET Qm and the like, there is provided a word line bootstrap circuit BST to be energized by the word line selective timing signal $\phi x'$. This word line bootstrap circuit BST makes the high level of the word line selective timing signal $\phi x$ to have a higher level that the power supply voltage Vcc by using the word line selective timing signal $\phi x'$ and its delay signal.

The above-described various timing signals are formed by a next timing signal generating circuit TG. The timing signal generating circuit TG may form a major timing signal indicated as its representative one. That is, this timing signal generating circuit TG receives address strobe signals $\overline{RAS}$ and $\overline{CAS}$ supplied from the external terminal and a write enable signal $\overline{WE}$ to form the above-described various series of timing pulses.

The timing signal generating circuit TG receives the internal complementary address signals a0 and a1 formed by the address buffer R-HDB. With this operation, the timing signal generating circuit GT, as shown in FIGS. 14(a) to 14(d), makes the dynamic RAM to show a function setting mode in response to the low level setting of the column address strobe signal $\overline{CAS}$ and the write enable signal $\overline{WE}$ before the row address strobe signal RAS is varied from its high level to its low level, and at this time discriminates the address signals A0 and A1 supplied to make either a reading-out test mode or a writing test mode. With this operation, the timing signal generating circuit TG may form various controlling signals corresponding to the set mode. As found in the present preferred embodiment, various controlling signals to be supplied from external side are combined to form a control signal for the test mode are disclosed and in addition to this process, for example, a specified test controlling terminal can be arranged.

A circuit denoted by a circuit symbol REFC is an automatic refresh circuit including a refresh address counter. This automatic refresh circuit REFC, although not particularly limited, may discriminate it as a refresh mode when the column address strobe signal $\overline{CAS}$ is set to a row level before the low address strobe signal $\overline{RAS}$ is made to have a low level by a logic circuit receiving the address strobe signals $\overline{RAS}$ and $\overline{CAS}$ and the write table signal $\overline{WE}$ and this circuit may transmit the refresh address signals a0' to am' formed by the address counter circuit having the above row address strobe signal $\overline{RAS}$ as a clock. The refresh address signals a0' to am' are transmitted to the low address decoder circuits R-DCR1 and R-DCR2 through the above lower address buffer R-ADB having a multiplexer function. Due to this fact, the refresh control circuit REFC may generate a control signal for changing-over the above address buffer R-ADB under a refresh mode (not shown). With this operation, one word line corresponding to the refresh address signals a0' to am' is selected and then a refresh operation of the memory cell connected to the word line is performed ($\overline{CAS}$ before $\overline{RAS}$ refresh)

In this preferred embodiment, a high speed reading-out test is enabled with the following test circuit TST. The above complementary data lines D0 and $\overline{D0}$ are respectively connected with the gates of MOSFET Q54 and Q55. As regards other complementary data lines, each of MOSFET Q56 and Q57 such as the illustrative complementary data lines Di and $\overline{Di}$ is arranged. Similarly, MOSFET Q54 and Q56 arranged in correspondence with the non-inverted data lines D0 to Di are arranged in parallel to each other with their drain and source being made common. MOSFET Q55 and Q57 arranged in correspondence with the inverted data lines $\overline{D0}$ to $\overline{Di}$ are also arranged in parallel to each other with their drain and source being applied common. Sources of the above MOSFET Q54 to Q57 are connected to the common source line C1. Drains of MOSFET Q54 and Q56 are connected to the drain line C0, and the drains of MOSFET Q55 and Q57 are connected to the drain line C0. The above source line C1 and drain line C0, C0 are precharged to a half precharge voltage HVC and a power supply voltage Vcc, respectively, through the pre-charged MOSFET Q50 to Q52. The source line C1 is pulled to a low level by MOSFET Q53 turned on in response to a control signal (a timing signal) RG for a reading test generated after the detecting amplifier SA starts to operate its amplifying operation.

Signals on the above drain lines C0 and C0 are supplied to the coincidence/non-coincidence circuit EX composed of an Exclusive AND circuit and the like, and a discriminated output PSR is outputted from this coincidence/non-coincidence circuit EX.

Figure 6:
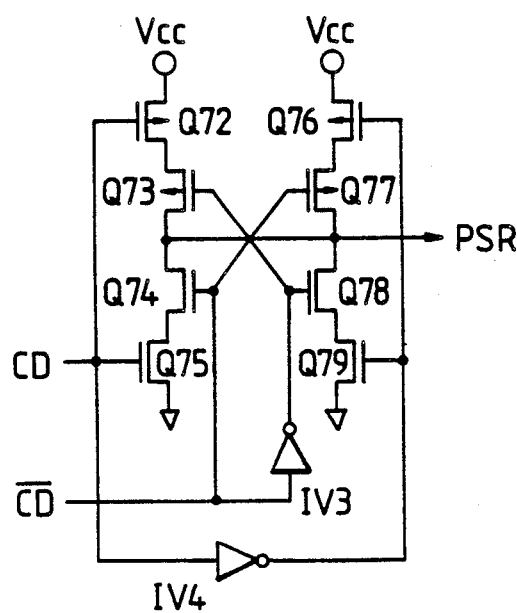
FIG. 6 is a circuit diagram for showing one preferred embodiment of a coincidence/non-coincidence circuit.

In FIG. 6 is illustrated a circuit diagram of a practical embodiment of the above coincidence/non-coincidence circuit EX.

P-channel MOSFET Q72 and Q73 and N-channel MOSFET Q74 and Q75 are connected in series form. There is provided a series-connected circuit comprising a similar P-channel MOSFET Q76 and Q77 and N-channel MOSFET Q78 and Q79. To the gates of the above P-channel MOSFET Q72 and N-channel MOSFET Q75 is supplied a signal of the above drain line C0. To the gates of other similar P-channel MOSFET Q76 and N-channel MOSFET Q79 in the series-connected circuit is supplied a signal on the above drain line C0 after being inverted by the inverter circuit IV4.

Gates of the above P-channel MOSFET Q73 and N-channel MOSFET Q78 of another series-connected circuit and gates of N-channel MOSFET Q74 and P-channel MOSFET Q77 of another series-connected circuit are connected in crossing relation to each other. To the gates of the MOSFET Q74 and Q77 is supplied a signal of the above drain line C0 and to other similar gates of MOSFET Q73 and Q78 is supplied a signal of the above drain line C0 after being inverted with an inverter circuit IV3. The above inverter circuits IV3 and IV4 may be eliminated and the signals of the above two drain lines C0 and C0 may directly be supplied to the corresponding gate of the MOSFET.

A connection point between the above MOSFET Q73 and Q74 and another connection point between MOSFET Q77 and Q78 are commonly connected to each other and acted as an output terminal of this coincidence/non-coincidence circuit EX.

In this preferred embodiment, if the signals on the above drain lines C0 and C0 are coincided with their high level to each other, N-channel MOSFET Q74 and Q75 are turned on to cause the output signal PSR to become a coincided signal of low level. In turn, if the signals of the above drain lines C0 and C0 are coincided with their low level to each other, N-channel MOSFET Q78 and Q79 in another series-connected circuit are turned on to form the output signal PSR Of low level in the same manner as above.

If one of the above drain lines C0 and C0 occupies a high level and the other occupies a low level, either P-channel MOSFET Q72 and Q73 or P-channel MOSFET Q76 and Q77 in another series-connected circuit are turned on, resulting in that the output signal PSR becomes a non-coincidence signal of a high level. As apparent from the previous description, it is to be noted that the coincidence/non-coincidence signals as defined herein have an opposite relation with the coincidence/-non-coincidence between the signals in the complementary data lines in the reading test and the data written in advance.

In the preferred embodiment, prior to the starting of the high speed reading test, the same stored information is written in all the memory cells. As this writing operation, for example, in addition to the process utilizing a writing operation with a unit of one bit, there are some processes in which as described above a simultaneous writing is carried out in all the memory cells which are connected to one word line or in which the same information is written at a high speed into all the bits by changing-over the word lines in sequence under utilization of an address advancing operation in a refresh mode while its detecting amplifier is operated under its simultaneous writing condition. This simultaneous writing operation can be set by utilizing the mode described in reference to FIGS. 14(a) to (d). In this case, if it is assumed that a high level (a logical "1") is written from the external terminal Din, this high level is stored in the information storing capacitor Cs of the memory cell connected to the non-inverted data lines D0 to Di, for example, and then a low level is accumulated in the information storing capacitor Cs of the memory cell connected to the inverted data lines $\overline{D0}$ to $\overline{Di}$.

Then, when the high speed reading test mode is set and one selective word line is selected, the stored information in the memory cell connected to the word line appears at one of the complementary data lines D0, $\overline{D0}$ to Di and $\overline{Di}$, and the above complementary data lines D0, $\overline{D0}$ to Di, $\overline{Di}$ are set to a high level/a low level by an amplifying operation of the detecting amplifier SA. During this chip non-selecting period before performing this reading operation, the complementary data lines D0, $\overline{D0}$ to Di, $\overline{Di}$ are half pre-charged, the drain lines C0, C0 of the test circuit TST are pre-charged to such a high level of a power supply voltage Vcc by the pre-charge MOSFET Q50 and Q52, the source line C1 is set to the half pre-charge voltage HVC by the pre-charge MOSFET Q51. Therefore, the above MOSFET Q52 to Q57 constituting the test circuit TST are all turned off with their gates and sources being set to their same potentials. With this arrangement, the pre-charging of the drain lines C0 and C0 can positively be carried out.

Under the amplifying operation of the above-described detecting amplifier SA, for example, if each of the data lines D0 to Di of non-inverted condition is set at a high level and each of the data lines $\overline{D0}$ to $\overline{Di}$ of non-inverted state is set at a low level, MOSFET Q54 and Q56 are turned on and MOSFET Q55 and Q57 are turned off. Therefore, under the reading test mode, if MOSFET Q53 is turned on by a timing signal RG generated after the above detecting amplifier SA starts an amplifying operation, the source line C1 is pulled to the low level, so that another drain line C0 keeps a high level. With this arrangement, the coincidence/non-coincidence circuit EX makes the output PSR a non-coincidence signal of high level. This means that this is a non-coincidence signal as viewed from the above coincidence/non-coincidence circuit EX and the above coincidence responses the fact that the read signal from the memory cell connected to the above word line shows a coincidence in all bits. That is, this means that pre-written information and information read under a test mode are coincided to each other over their entire bits. To the contrary, in case that there is at least one of the inverted data lines $\overline{D0}$ to $\overline{Di}$ in the above pair of complementary data lines kept at its high level, MOSFET arranged in compliance with the inverted data line is turned on. Due to this fact, the coincidence/non-coincidence circuit EX makes its output PSR as a coincidence signal of low level. With this arrangement, it is possible to detect that there is an erroneous read-out stored information in the memory cell connected to the above word line. That is, it is possible to detect that there is a memory cell in which a prewritten information and a read information under a reading test mode are not coincided to each other. Such a detecting signal PSR as above is transmitted to a data output buffer DOB through a multiplexer MPX arranged at an output part of the main amplifier MA and outputted as a high level/low level signal from the external terminal Dout. Such a test result as above is outputted as a high level/-low level, it is possible to perform the reading-out test while RAM being mounted on the actual board such as a printed circuit board.

Under this preferred embodiment, a strobe signal $\overline{RAS}$ is clock operated as shown in FIG. 14(a), the address advancing operation is carried out in the same manner as that of the above-described refreshing operation (the advancing operation being performed for the refreshing address signals a0′ to am′).

Figure 5:
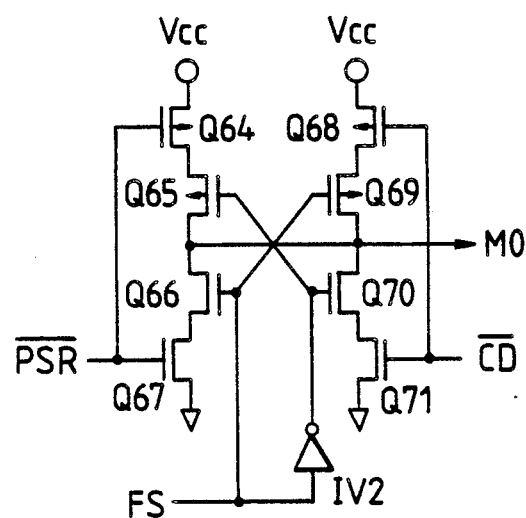
FIG. 5 is a circuit diagram for showing one preferred embodiment of a multiplexer circuit.

In FIG. 5 is illustrated a circuit diagram of one preferred embodiment of the multiplexer MPX arranged in the above main amplifier MA.

In this preferred embodiment, an output signal ($\overline{CD}$) of the main amplifier MA (not shown) corresponding to an inverted common data line $\overline{CD}$ and a unit circuit corresponding to an inverted detected signal $\overline{PSR}$ are illustrated. The output signal $\overline{CD}$ corresponding to the above inverted common data line $\overline{CD}$ is commonly supplied to the gates of the P-channel MOSFET Q68 and N-channel MOSFET Q71. Between the above MOSFET Q68 and MOSFET Q71 are arranged P-channel MOSFET Q69 and N-channel MOSFET Q70 connected in series. To the gate of the above MOSFET Q69 is supplied a control signal (changing-over control signal) FS for a reading test mode and to the gate of MOSFET Q70 is supplied the above control signal FS while being inverted through the inverter circuit IV2.

The above inverted detecting signal $\overline{PSR}$ is formed by the above detecting signal PSR through the inverter circuit (not shown) arranged within the above testing circuit TST. This detecting signal $\overline{PSR}$ is commonly supplied to the gates of P-channel MOSFET Q64 and N-channel MOSFET Q67. Between the above MOSFET Q64 and Q67 are arranged P-channel MOSFET Q65 and N-channel MOSFET Q66 connected in series to each other. To the gate of the above MOSFET Q66 is supplied the above changing over control signal FS and to the gate of MOSFET Q65 is supplied the above control signal FS through the inverter circuit IV2 while being inverted. Each of the connection points between the above P-channel type Switches MOSFET Q65 and Q69 and N-channel type switch MOSFET Q66 and Q70 is commonly connected to each other, resulting in making the above output node M0.

For example, under a normal operating mode, the control signal FS is set at a low level. Due to this fact, P-channel MOSFET Q69 and N-channel MOSFET Q70 corresponding to an output signal $\overline{CD}$ of the above main amplifier MA are turned on, the above output signal $\overline{CD}$ is inverted to be transmitted to the output node M0. To the contrary, if a reading test mode is set, the control signal FS is set to a high level. Thus, P-channel MOSFET Q65 and N-channel MOSFET Q66 corresponding to the above detecting signal $\overline{PSR}$ are turned on to cause the above detecting signal $\overline{PSR}$ to be inverted and transmitted to the output node M0. Another similar unit circuit is provided and a non-inverted signal CD outputted from the above main amplifier MA by this unit circuit is changed over with a signal corresponding to the above detecting signal PSR. Due to this fact, as described above, the above inverted detecting signal $\overline{PSR}$ is formed by an inverter circuit not shown.

Figure 2:
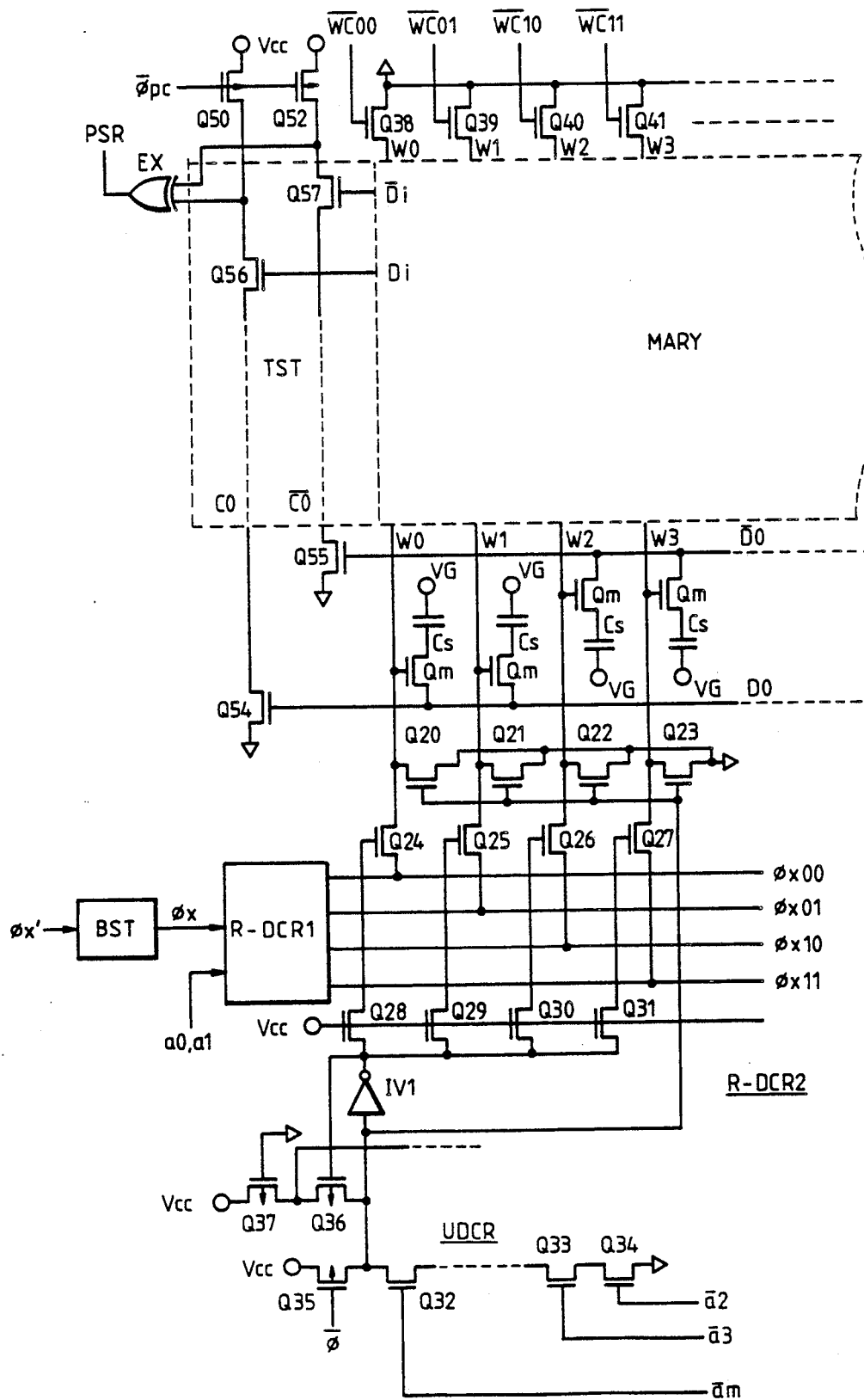
FIG. 2 is a circuit diagram for showing a substantial part of the second preferred embodiment of a dynamic RAM of the present invention.

In FIG. 2 is illustrated a substantial circuit diagram of another preferred embodiment of the present invention.

In this preferred embodiment, a connecting method for MOSFET constituting the above test circuit TST is different from that shown in FIG. 1. However, other constitutions are the same as those shown in FIG. 1.

In case of the test circuit TST in this preferred embodiment, the above complementary data lines D0 and $\overline{D0}$ are provided with MOSFET Q54 and Q55 to which the gates are connected. As regards other complementary data lines Di and $\overline{Di}$ illustrated schematically, each of MOSFET Q56 and Q57 is provided. Similarly, MOSFET Q54 and Q56 etc. arranged in compliance with the non-inverted data lines D0 to Di are connected in series to each other. MOSFET Q55 and Q57 arranged in compliance with the inverted data lines $\overline{D0}$ to $\overline{Di}$ are also connected in series. Sources of MOSFET Q54 and Q55 are connected to the ground potential of the circuit and the drains of MOSFET Q56 and Q57 are provided with the precharged MOSFET Q50 and Q52. Drain outputs of the above MOSFET Q56 and Q57 are supplied to the above-described coincidence/non coincidence circuit EX.

With this arrangement, a writing operation is carried out in advance in the same manner as described above. Thereafter, one word line is selected and if each of the non-inverted data lines D0 to Di is in a high level under an amplification operation of the detecting amplifier SA, a discharging operation is performed through a series pass C0 of MOSFET Q54 to Q56, resulting in that an output signal of low level is attained. In case that there is a memory cell for use in feeding at least one erroneous reading-out signal (information), MOSFET corresponding to the non-inverted data line which corresponds to the memory cell of a plurality of MOSFET (Q54, Q56) connected in series to each other. As a result, the drain output of MOSFET Q56 is also kept in its high level pre-charged condition since the above formed discharging current flow path is shut. With this arrangement, since the coincidence/non-coincidence circuit EX causes the output signal PSR to be a low level of coincidence sensing and thus it is apparent that there are some reading information and a poor memory cell.

With this arrangement, MOSFETs are connected in series to each other, so that their layout can be set in a high density. The number of MOSFETs to be connected in series in compliance with the number of complementary data lines is increased, the time required for the above-described discharging operation is extended and if the reading-out discrimination is delayed, the series-connected circuit of MOSFET connected in series as described above may be divided into a plurality of sets. In this case, there are a pre-charged circuit and the coincidence/non-coincidence circuit in response to each of the divided series connected circuits, and the output signal of the coincidence/non-coincidence circuit is passed through AND gate circuit to get an output signal of the test circuit TST.

Figure 3:
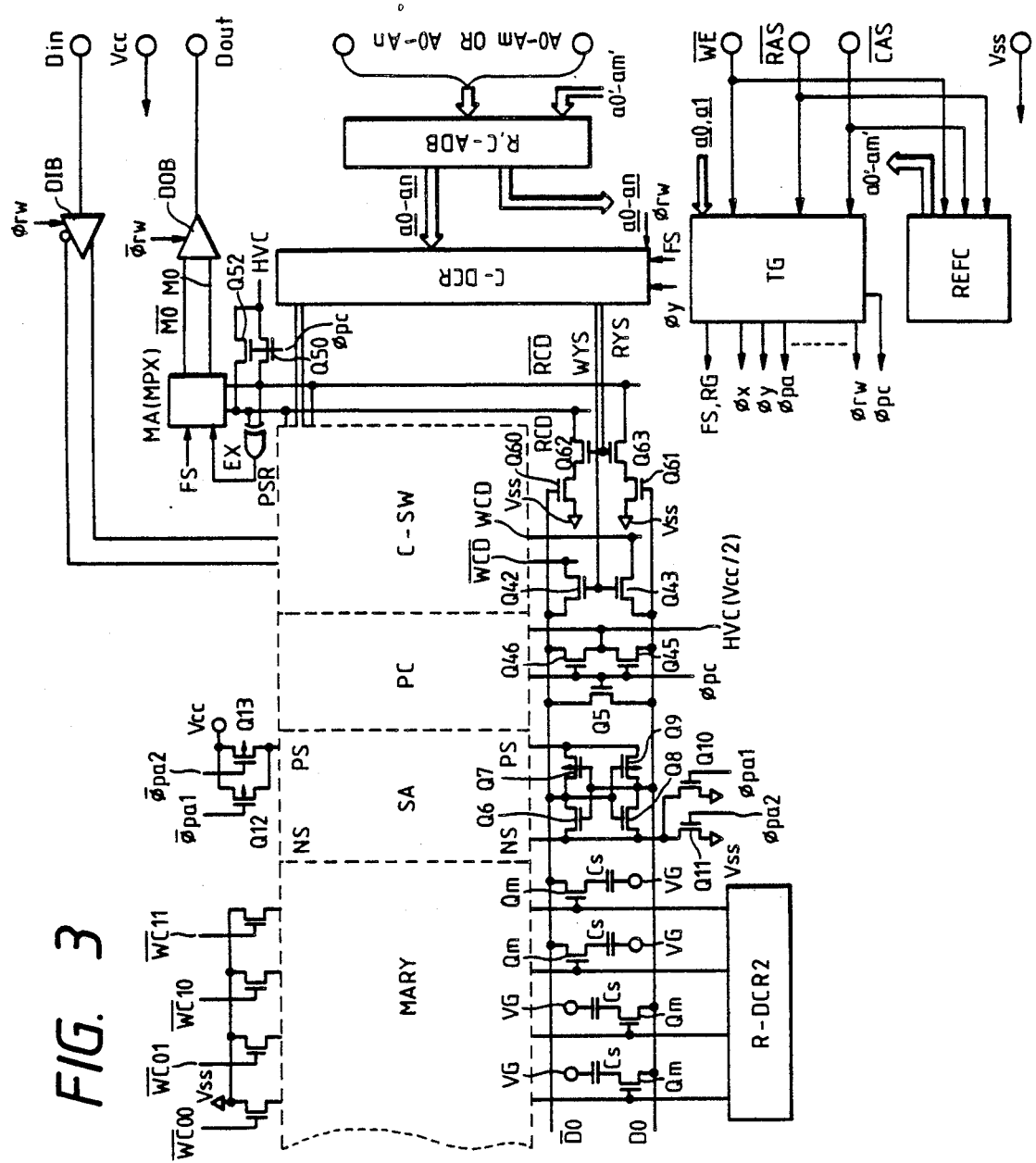
FIG. 3 is a circuit diagram for showing a substantial part of the third preferred embodiment of a dynamic RAM of the present invention.

In FIG. 3 is illustrated a substantial circuit diagram of another preferred embodiment of the present invention.

In the constitution in which the gate of MOSFET is connected to the complementary data line in order to perform a reading test as described above, a signal corresponding to the signal in the data line to which the MOSFET is connected is attained from the drain of MOSFET. In view of this fact, in the preferred embodiment, a testing function and a high speed reading function are combined with each other. The dynamic type RAM of the present preferred embodiment is constructed substantially in the same manner as that of the dynamic type RAM shown in FIG. 1. Portions which are different from those in the above-described preferred embodiment will be mainly explained. In the present preferred embodiment, the sources of MOSFET Q61 and Q60 of which gates are connected to the above complementary data lines D0 and $\overline{D0}$ are connected to the ground potential Vss. The drains of the above MOSFE Q60 and Q61 are connected to the common reading complementary data lines $\overline{RCD}$ and RCD through the Switching MOSFET Q63 and Q62 constituting the reading column switch. In this case, since the above MOSFET Q60 and Q61 may perform an inverted amplifying operation, the drain output of MOSFET Q61 corresponding to the non-inverted data line D0 is connected to the inverted reading common data line $\overline{RCD}$ through a column switch MOSFET Q63 and the drain output of MOSFET Q60 corresponding to the inverted data line $\overline{D0}$ is connected to the non-inverted reading common data line RCD through the column switch MOSFET Q62.

The reading common complementary data lines RCD and $\overline{RCD}$ are connected to an input of the above coincidence/non-coincidence circuit EX and an input of the main amplifier MA. The switch MOSFET is arranged between an input node of the above coincidence/non-coincidence circuit EX and the common complementary data lines RCD and $\overline{RCD}$ and only when the reading test is to be performed, the signals of the above reading common complementary data lines RCD and $\overline{RCD}$ may be transmitted to the above coincidence/non-coincidence circuit EX.

In the present preferred embodiment, apart from the reading common complementary data lines RCD and $\overline{RCD}$, the writing common complementary data lines WCD and $\overline{WCD}$ are independently arranged and then connected to the above complementary data lines D0 and $\overline{D0}$ through the column switches MOSFET Q42 and Q43. This constitution is the same as that of the common complementary data lines CD and $\overline{CD}$ and the column switch circuit described in reference to FIG. 2. To the above writing common complementary data lines WCD and $\overline{WCD}$ is connected an output terminal of the data input buffer DIB.

In correspondence with the arrangement of the above reading and writing column switches, the column decoder C-DCR is arranged to have a reading column selective line RYS and a writing column selective line WYS in correspondence with a pair of complementary data lines D0 and $\overline{D0}$ etc. In order to perform the one word line writing and reading test, the above column decoder C-DCR has an additional function to make a simultaneous selection of full column switch selecting lines RYS and WYS. This simultaneous selecting function is carried out by the above control signal FS. For example, each of the output portions of the column decoder C-DCR is provided with an output circuit composed of OR gate circuit, a corresponding selective signal of the above column decoder C-DCR is supplied to one of the input nodes of each of OR gate circuits and the above control signal FS is supplied to the other input node. With this arrangement, the above signal FS is kept at its high level and all the outputs of the decoder C-DCR are set to a high level selective condition without having any relation with the output signals (decoding signals) of the decoder corresponding to the address signals A0 to An.

Under the normal reading operation mode, the above control signal FS is set at its low level. With this arrangement, the column decoder C-DCR may interpret the supplied address signals A0 to An in the column system and cause one column selective line RYS to be selected in synchronism with a data line selective timing signal $\phi y$. In this case, the above timing signal $\phi y$ can be generated at a faster timing than that of the preferred embodiment shown in FIG. 1 or FIG. 2. That is, the above timing signal $\phi y$ can be generated in correspondence with an input of the column address signals A0 to An without waiting a completion of the amplifying operation of the detecting amplifier SA. In this way, even if the selecting operation is made faster in the column system, there is no problem at all due to the fact that the above complementary data lines D0 and $\overline{D0}$ etc. and the above reading common complementary data lines RCD and $\overline{RCD}$ are electrically separated by the amplifying MOSFET Q60 and Q61 etc. Further, signals (potentials) in the complementary data lines D0 and $\overline{D0}$ in compliance with the amplifying operation of the above detecting amplifier SA are further amplified by the above MOSFET Q60 and Q61 etc. and transmitted to the above reading common complementary data lines RCD and $\overline{RCD}$. With this arrangement, a high speed reading can be performed.

In turn, under a high speed reading test mode, the above control signal FS is set to its high level, thereby all the reading column selective lines are set to a selective state. Therefore, MOSFET Q60 and Q61 etc. acting as the above amplifying MOSFET are connected in parallel to each other by the column switchs MOSFET Q62 and Q63 etc. That is, the amplifying MOSFETs corresponding to the inverted data lines ($\overline{D0}$ to $\overline{Dn}$) are connected in parallel to each other through the corresponding column switch MOSFET, and the amplifying MOSFETs corresponding to the non-inverted data lines (D0 to Dn) are connected in parallel to each other. With this arrangement, in a case where the same information is already written in a plurality of memory cells which are simultaneously selected and simultaneously connected to the reading common complementary data lines RCD and $\overline{RCD}$, one of the common data lines RCD and $\overline{RCD}$ becomes a high level (HVC) and the other becomes a low level (Vss) if there is no defect in the memory cell etc., resulting in that the non-coincidence signal is outputted from the above coincidence/non-coincidence circuit EX. To the contrary, in case that there is a memory cell having some defects in the memory cell simultaneously selected and further that a pair of information corresponding to the memory cell are written, the level is inverted between the data lines. Due to this fact, either one of the common data line RCD or $\overline{RCD}$ to be kept at a high level becomes a low level. As a result, the output signal FSR of the coincidence/non-coincidence circuit EX may form a coincidence signal of low level (a reading error).

It is to be noted that a writing of the same information in the memory cell to be selected simultaneously means that when an amplifying operation is carried out with the detecting amplifier, each of the inverted data lines ($\overline{D0}$ to $\overline{Dn}$) corresponding to each of the memory cells takes the same logic potential and each of the non-inverted data lines (D0 to Dn) takes the same logic potential, and then the information is written into each of the memory cells.

Under the normal writing mode, the column decoder C-DCR may select the writing column selective line WYS. With this operation, the writing signals supplied to the writing common complementary data lines WCD and $\overline{WCD}$ are transmitted to the complementary data lines through the column switch MOSFET turned on in response to the column selective line WYS set to a selective level of a plurality of column switches MOSFET and then written into the selected memory cell. Under a high speed writing mode, all the column selective lines WYS are set to their selected state, all the writing signals supplied to the above common complementary data lines WCD and $\overline{WCD}$ are transmitted to all the complementary data lines, resulting in that a simultaneous writing of the information into a plurality of memory cells corresponding to one word line. At this time, in order to drive all the complementary data lines, the above data input buffer DIB has a relative high current driving capacity. After this operation, the detecting amplifier SA is set to its operating condition, for example, an address advancing operation in a refreshing operation is utilized to select a subsequent changing-over of all the word lines, thereby the same information can be written into all the memory cells.

In the preferred embodiment, to the reading common complementary data lines RCD and $\overline{RCD}$ is applied the above-described half pre-charged voltage HVC through MOSFET Q50 and Q52 switch controlled by a pre-charged control signal $\phi pc$. With this operation, each of the common data lines RCD and $\overline{RCD}$ is pre-charged to the half precharge voltage HVC before the normal reading operation and the reading test mode are started. Of course, the power supply voltage Vcc may be applied in place of the half pre-charge voltage HVC.

In the preferred embodiment, the column decoder C-DCR may receive a read-write control signal $\phi rw$, wherein a selective signal is supplied to the column selective line RYS during the reading operation (including a reading test mode) and a selective signal is supplied to the column selective line WYS during the writing operation (including a high speed writing mode). In order to realize this operation, for example, a switch is arranged between an output node of OR gate circuit arranged at each of the output portions of the above column decoder C-DCR and the column selective line WYS, a switch is also arranged between the same output node and the column selective line RYS and these switches are complementarily turned on or off by the above control signal $\phi rw$. Of course there may be provided a writing exclusive column decoder and a reading exclusive column decoder and they may be operated complementarily by the control signal φrw.

Figure 4:
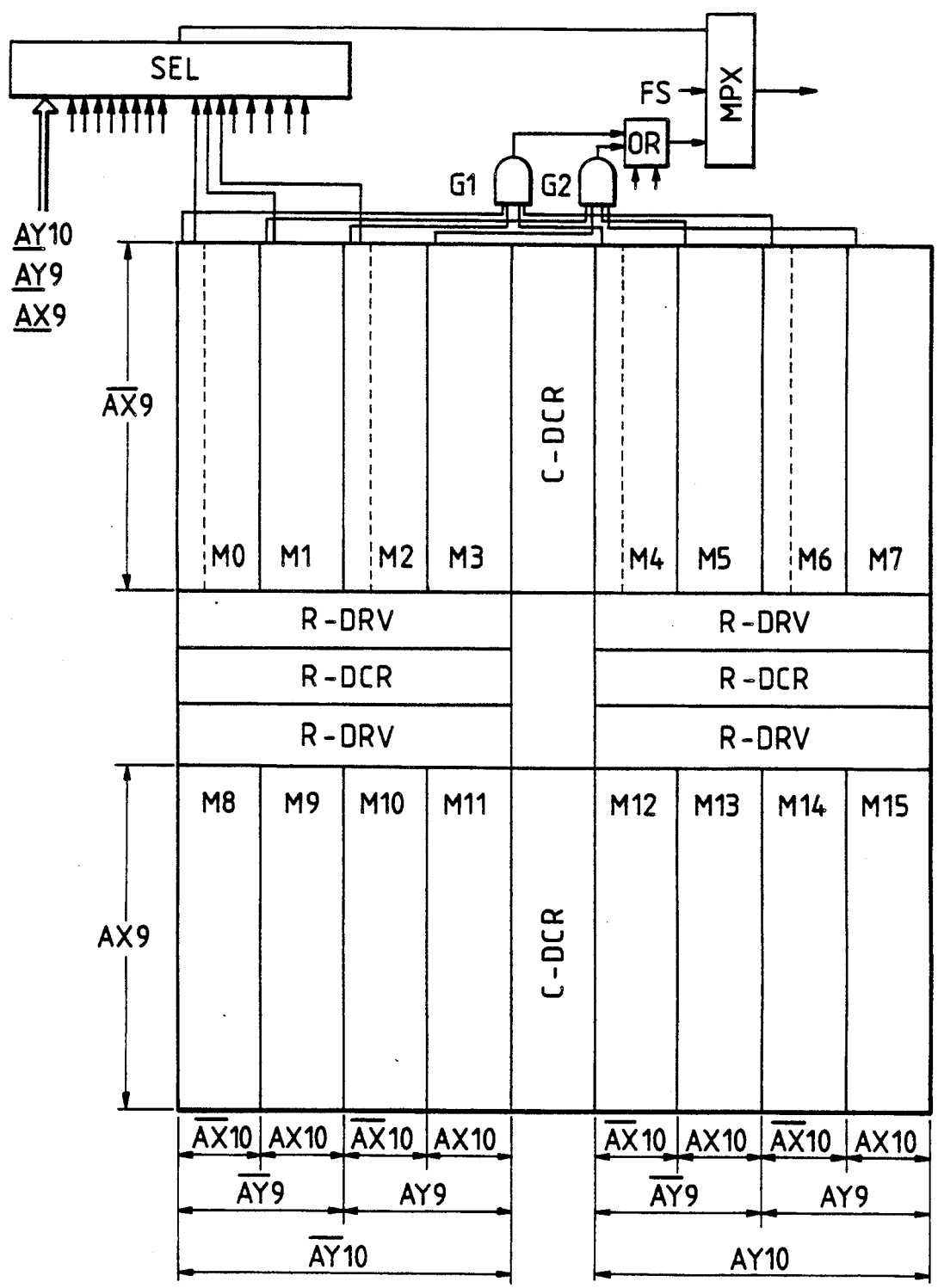
FIG. 4 is a block diagram for showing a substantial part of the fourth preferred embodiment of a dynamic RAM of the present invention.

In FIG. 4 is illustrated a block diagram of a major preferred embodiment of the dynamic type RAM of the present invention. Each of the blocks in this figure is drawn in compliance with an actual geographic arrangement.

RAM in this preferred embodiment has a large memory capacity of about 4M bits in total.

Due to this fact, the memory part is comprised of sixteen memory mats such as memory mats M0 to M15. Each of the memory mats M0 to M15 is comprised of a memory array MARY, a detecting amplifier SA, a precharging circuit PC and a column switch C-SW etc. as shown in each of FIGS. 1 to 3.

The above memory mats M0 to M16 are arranged in upper and lower divided segments such as M0 to M7 and M8 to M16 as shown in the figure and in addition they are divided into the right and left segments such as M0 to M3, M4 to M7 and M8 to M11, M12 to M14, respectively. Therefore, as a whole, they are arranged in divided four blocks in their right and left portions. Each of these four blocks has a memory capacity of about 1M bits (1024×1024) and in total they have a memory capacity of about 4M bits.

At a central part of each of the divided right and left blocks is arranged longitudinally the column decoder C-DCR. At the central portions of the upper and lower divided blocks are arranged the row decoder R-DCR and the driving circuit R-DRV in compliance with each of the memory mats.

As regards an assignment of address for the above memory mat and the memory block, for example, the above upper and lower divided memory mats M0 to M7 and M8 to M15 are specified by the low address signals AX9 and $\overline{AX9}$ (a9, $\overline{a}$9). The right and left divided memory mats M0 to M3, M8 to M11 and M4 to M7, M12 to M15 are specified by the column address signals AY10, $\overline{AY10}$ (a10, $\overline{a}$10). Referring now to the memory block composed of the memory mats M8 to M11, the memory mats M8, M9 and M10, M10 are selected by specifying the column address signals AY9, $\overline{AY9}$ (a9, $\overline{a}$9) of the column. A selection of the adjoining memory mats M8 and M9 is performed by specifying them with the row address signals AX10 and $\overline{AX10}$ (a10, $\overline{a}$10). This is also applied to the case of the memory mats M10 and M11. Assignment of the addresses by two bits of the above row address signal AX10 (a10, $\overline{a}$10) and the column address signal AY9 (a9, $\overline{a}$9) is also the same as that of another memory block.

Therefore, when one set of row address signals is settled, each of the word lines of four memory mats M0, M2, M4 and M6 denoted with some dotted lines in the figure is set to its selective condition. Thus, when a high speed reading test is performed, an output signal (PSR) of the coincidence/non-coincidence circuit (not shown) of the test circuit arranged in each of the above four memory mats is inputted to AND gate circuit G1 and a high level signal is outputted when a reading error is not present in any one of the above four memory mats. Similarly, the output signals of the coincidence/non-coincidence circuit (not shown) of the memory mats M1, M3, M5 and M7 where the word line is simultaneously set to its selective condition are inputted to AND gate circuit. This is made such that the above similar AND gate circuit is also arranged in the lower arranged memory mats M8 to M15. Output signals of these AND gate circuits are supplied to OR gate OR and the output of the OR gate circuit OR is outputted to an external terminal through the multiplexer MPX.

Although the word lines of the above four memory mats are simultaneously selected, one of them is selected by the upper-most column address signal AY10 and the column address signal AY9 and a writing and a reading with a unit of one bit are carried out. That is, each of the memory mats is provided with a main amplifier (not shown) and an output signal from each of the main amplifiers is supplied to a selection circuit SEL. This selection circuit SEL may select the output signals of the memory mats indicated by the address signals Ay9, AY10 and AX9 and then a selected output signal is supplied to the multiplexer MPX. The multiplexer MPX may transmit the output signal of OR gate circuit OR or the selective circuit SEL through an output buffer circuit DOB in compliance with a potential of the control signal FS described above. As regards the writing circuit, its drawing is eliminated for the sake of clarity.

In case of the constitution in which the word lines of the above four memory mats as disclosed in the above preferred embodiment, the presence or non-presence of all the bit reading errors can be discriminated by changing over the word lines of 1024 cycles irrespective of arranging of a memory capacity of about 4M bits of RAM. Similarly, in case that the above high speed writing operation is performed, it is possible to write the same stored information of about 4M bits under 1024 cycles. As described above, in case of the constitution in which the word lines of four memory mats are selected, the refreshing operation is also completed one time with 1024 cycles.

Figure 7:
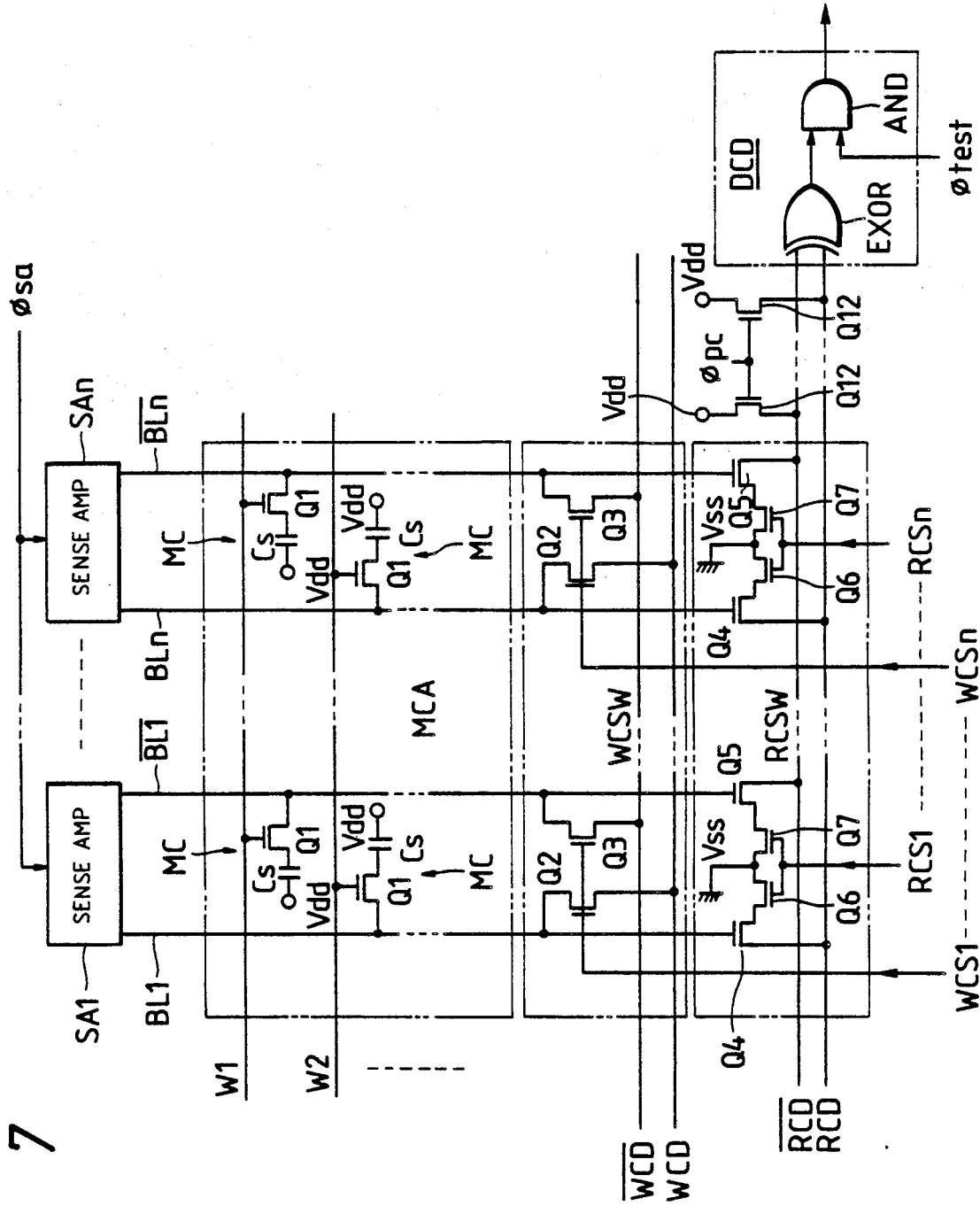
FIG. 7 is a circuit diagram for showing a substantial part in DRAM of the fifth preferred embodiment of the present invention.
Figure 8:
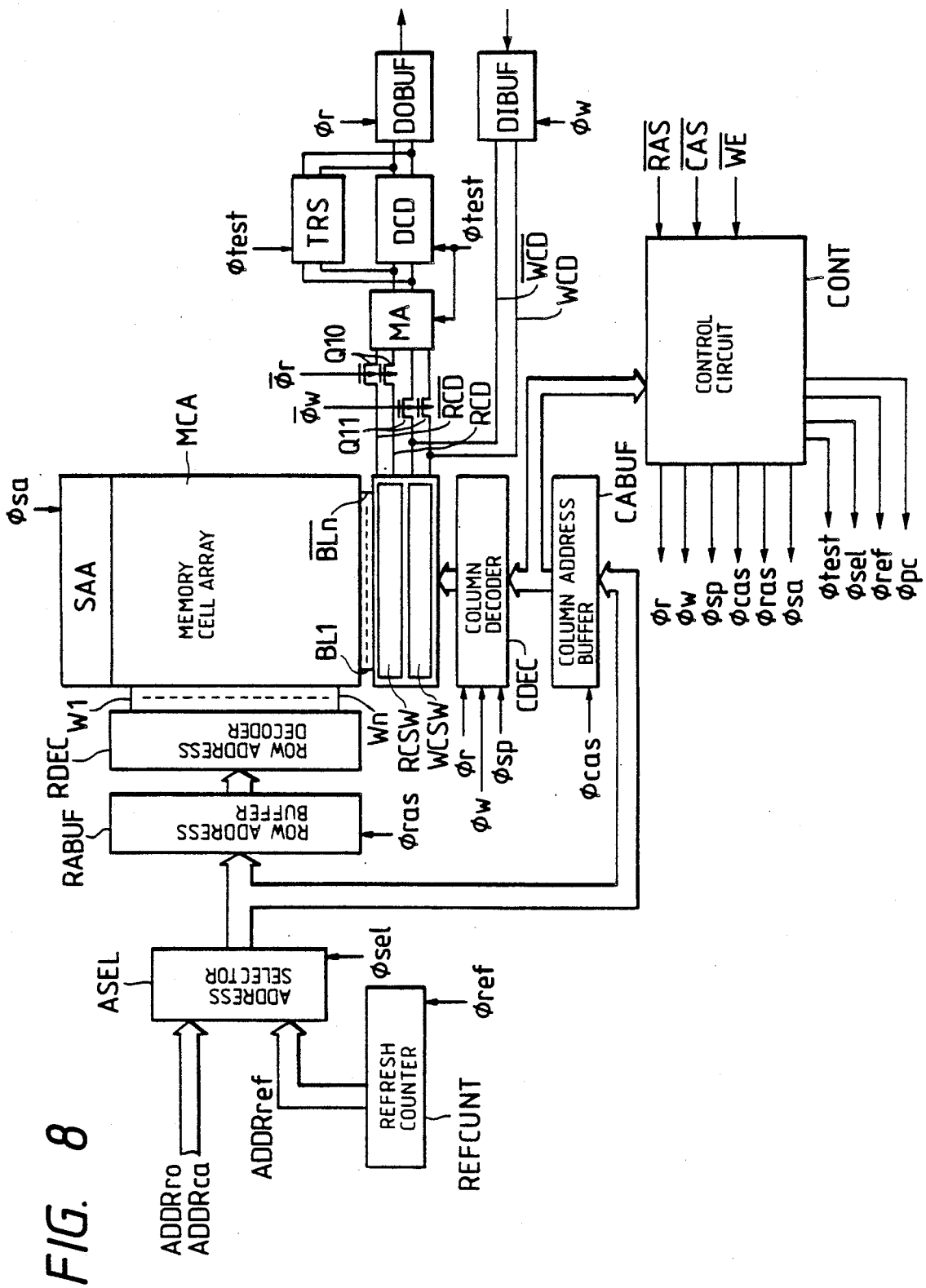
FIG. 8 is a block diagram for showing an entire DRAM of the present invention.

In FIG. 7 is illustrated a circuit diagram of another preferred embodiment of the present invention. In this figure, a substantial part of DRAM is illustrated. In FIG. 8 is shown a block diagram for showing an entire DRAM of the preferred embodiment shown in FIG. 7. DRAM in this preferred embodiment, although not particularly limited, is formed as one semiconductor substrate by a well-known integrated circuit manufacturing technology.

Although not particularly limited, DRAM of the present preferred embodiment has a memory array MCA in which a plurality of one-transistor type dynamic memory cells MC having N-channel type MOS-FET Q1 and a stored capacity Cs connected in series are arranged in a matrix form. The memory cells MC are connected to each of the complementary bit line pairs BL1, BL1 to BLn, $\overline{BLn}$ arranged by a back-to-back data line system by equal numbers for every lines through the data I/O terminal, the selective terminal of each of the memory cells MC (a gate electrode of MOS-FET Q1) is connected to the word lines W1 to Wn in each of the corresponding columns. In the present preferred embodiment, a plurality of memory cells MC having selective terminals connected to the same word line to each other are arranged such that as shown in FIG. 7, their I/O terminals are connected to the inverted bit lines BL1 to $\overline{BLn}$ (or non-inverted bit lines BL1 to BLn).

A selection of the above word lines W1 to Wn is carried out by a row decoder RDEC shown in FIG. 8. This row decoder RDEC may interpret a plurality of address signals supplied from the row address buffer RABUF and drive the desired one word line indicated by its address signal of the above word lines W1 to Wn to its selective level.

At one end of each of the complementary bit line pairs BL1, $\overline{BL1}$ to BLn, $\overline{BLn}$ is arranged each of the differential amplifier type detecting amplifiers SA1 to SAn. Since the constitution of the detecting amplifier etc. is illustrated in the preferred embodiment of FIG. 1, its practical constitution is not illustrated. In the same manner as that of the preferred embodiment shown in FIG. 1, each of the detecting amplifiers SA1 to SAn includes a power switch element not shown. A control signal $\phi$sa for these power switch elements not shown in asserted, thereby each of the detecting amplifiers SA1 to SAn can be amplified and a minute potential between the pair of bit lines is detected and amplified. In FIG. 8, the detecting amplifiers SA1 to SAn are illustrated as a row of detecting amplifiers SAA.

In turn, the other ends of each of the above bit line pair BL1, $\overline{BL1}$ to BLn, $\overline{BLn}$ are connected in common to the writing complementary data line pairs WCD and $\overline{WCD}$ through the writing column switch circuit WCSW, and further connected in common to the reading complementary common data line pairs RCD and $\overline{RCD}$ through the reading column switch circuit RCSW.

Although not particularly limited, the above writing column switch circuit WCSW is comprised of N-channel type transfer MOSFET Q2 and Q3 for connecting each of the bit line pairs BL1, $\overline{BL1}$ and BLn, $\overline{BLn}$ to the writing common data line pairs WCD and $\overline{WCD}$. Each of the transfer MOSFET Q2 and Q3 is switch controlled by the column selective signals WCS1 to WCSn which may correspond to the bit line pairs.

The above reading column switch circuit RCSW, although not particularly limited, is constituted by N-channel type control MOSFET Q4 and Q5 acting as the first switch element for connecting the bit line pairs BL1, $\overline{BL1}$ to BLn, $\overline{BLn}$ to the reading common data line pairs RCD, $\overline{RCD}$ and N-channel type selective MOSFET Q6 and Q7 acting as the second switch element for enabling the above control MOSFET Q4 and Q5 to be selectively connected to the ground terminal Vss of a circuit. Each of the selective MOSFET Q6 and Q7 is switch controlled by the column selective signals RCS1 to RCSn corresponding to each of the bit line pairs.

In case that a data reading is performed from the memory cells, a minute potential difference between the bit line pairs is amplified by the above detecting amplifiers SA1 to SAn and then a complementary level load is applied to the bit line pairs. At this time, the above controlling MOSFET Q4 and Q5 connected to the selective MOSFET Q6 and Q7 which are turned on by the column selecting signal are switch operated in response to the complementary level of the bit line pairs. For example, the control MOSFET Q4 is turned on by a potential of the bit line BL1 and the control MOSFET Q5 is turned off in compliance with a potential of the bit line $\overline{BL1}$. With this arrangement, the above reading common data line RCD is discharged and the other reading common data line $\overline{RCD}$ keeps its pre-charged level.

At this time, since gate capacities of the control MOSFET Q4 and Q5 are present between the bit line pairs and the reading common data line pairs RCD and $\overline{RCD}$, the reading common data line pairs RCD and $\overline{RCD}$ for the bit line pairs may not constitute undesired load. Therefore, even if the selective MOSFET Q6 and Q7 are controlled to be turned on before a specified timing of the amplification performed by the detecting amplifiers SA1 to SAn, a non-desired noise is not applied from the reading common data line pairs RCD and $\overline{RCD}$ to the detecting amplifier and the potentials of the reading common data line pairs RCD and $\overline{RCD}$ are rapidly determined in response to the data read out from the memory cells to the bit line.

Further, even if the selective MOSFET Q6 and Q7 are turned on, the bit line pairs and the reading common data line pairs RCD and $\overline{RCD}$ are not electrically and directly connected under an action of the gate capacity of the control MOSFET Q4 and Q5. Due to this fact, even if the column selective signals RCS1 to RCSn are all driven to their selection levels, i.e. even if all the bit line pairs are selected simultaneously, the levels of the reading common data line pairs RCD and $\overline{RCD}$ may not influence against the reading data level on each of the bit line pairs.

The above column selection signals RCS1 to RCSn and WCS1 to WCSn are outputted from the column decoder CDEC. To this column decoder CDEC are supplied a control signal $\phi$r for indicating a specifying/non-specifying of the reading operation, a control signal $\phi$w for indicating a specifying/non-specifying of a writing operation, an initializing mode or testing mode of which details will be described later and a control signal $\phi$sp for indicating a setting/non-setting of a special mode such as a refreshing mode etc. The column decoder CDEC may decode the column address signal supplied from the column address buffer CABUF and drive the desired column selective signal corresponding to the address signal to a selection level when the above special mode is not set, i.e. when the control signal $\phi$sp is negated. At this time, in case that the reading operation is instructed, i.e. when the control signal $\phi$r is asserted, the desired one corresponding to the above address signal is driven to a selection level from the column selection signals RCS1 to RCSn. In turn, in case that the writing operation is instructed, i.e. when the control signal $\phi$w is asserted, desired one corresponding to the above column address signal is driven to a selective level from the column selection signals WCS1 to WCSn. In turn, in case that the control signal $\phi$sp is asserted, the output from the column decoder CDEC is made to have no relation with the input column address signal. In this case, when the control signal $\phi$w is asserted, all the column selection signals WCS1 to WCSn are driven to the selective level. In turn, when the control signal $\phi$r is asserted, all the column selective signals RCS1 to RCSn are driven to the selective level.

In this case, under the above initializing mode, data of either a logic "1" or logic "0" is simultaneously written into the memory cell of one line (one word line) under a selective operation of one time word line selecting operation and this is an initializing operating mode in which all the holding data of the memory cell array MCA are initialized to either a logic "1" or a logic "0". The above test mode is an operating mode for discriminating a good or bad condition of the memory array MCA by reading the memory cells initialized by the initializing mode in line by line basis. In DRAM of the present preferred embodiment, in case that the above initializing mode or a special mode such as a test mode is not set, although not particularly limited, a normal access mode such as a read or write mode is set.

Although not particularly limited, the addressing of the memory cell MC can be classified into a case in which it is performed with a row address signal ADD- Rro supplied from an external side with a time sharing and a column address signal ADDRca and another case in which it is carried out with an address signal ADDRref outputted from the refresh counter REFCUNT.

The above address signal ADDRro and the above address signal ADDRref are selectively supplied to the row address buffer RABUF. This selection is performed by the address selector ASEL. To the address selector ASEL is supplied a selection control signal $\phi$se1. The address selector ASEL may select and output the address signal ADDRro when the selective control signal $\phi$se1. In turn, when the selective control signal $\phi$se1 is negated, the address signal ADDRref is selected and outputted.

Although not particularly limited, the column address signal ADDRca may be supplied to the column address buffer CABUF by the address selector ASEL in the preferred embodiment without performing the selective operation.

In this case, a negation of the selective control signal $\phi$se1 is defined as a case in which an initializing mode or a test mode as well as a special mode such as a refresh mode are set. That is, the address signal ADDRref is not only defined as a refresh address, but also it may be used as a row address signal required for performing the initializing mode or a test mode. The refresh counter REFCUNT may perform an address incrementation in response to the control signal $\phi$ref. When the initializing mode, a test mode or a special mode such as a refresh mode are set and the above control signal $\phi$ref is asserted, the above refresh counter REFCUNT may start the address incrementation. Although not particularly limited, the address incrementing operation performed by the refresh counter REFCUNT is maintained until all the word lines stored in the memory cell array MCA are selected in sequence under a desired cycle.

The column address buffer CABUF takes the column address signal supplied to it. This taking timing is defined by an assert timing of the control signal $\phi$cas. In turn, the row address buffer RABUF may also take the address signal supplied to it. This taking timing is defined by the assert timing for the control signal $\phi$ras.

The above writing common data line pairs WCD and $\overline{WCD}$ are connected to the output terminals of the data input buffer circuit DIBUF.

The above reading common data line pairs RCD and $\overline{RCD}$ and the writing common data lines WCD and $\overline{WCD}$ are connected to the main amplifier MA through P-channel type selective MOSFET Q10, Q10 and Q11 and Q11. The above selective MOSFET Q10, Q10 are controlled to be turned on by the control signal $\phi$r asserted when the data reading operation is carried out from the memory cells. In turn, the selective MOSFET Q11 and Q11 are controlled to be turned on by the control signal $\phi$w. With this arrangement, the above main amplifier MA ma amplify the data read out of the memory cell when the data is read out. In turn, in case of writing data, it may amplify the data supplied from the data input buffer DIBUF.

In the above main amplifier MA the data read out of the memory cell is amplified and the amplified data is supplied to the outer terminal of the amplification. The amplification output terminal is connected in parallel with the input terminals of the discrimination circuit DCD and the transmittance circuit TRS. Each of the output terminals of these circuits is connected in common to the data output buffer DOBUF. The above main amplifier MA, although not particularly limited, is constructed such that when the DRAM is set at its test mode, i.e. when the control signal $\phi$test is asserted, and in case that levels of the reading common data line pairs RCD and $\overline{RCD}$ are set at the same phases to each other, an amplified output of the same phase ca be supplied to the above amplification output terminal in response to the above cases. The above discrimination circuit DCD employs an exclusive AND in respect to the levels of the reading common data line pairs RCD and $\overline{RCD}$ during the test mode, discriminates a coincidence and a non-coincidence of that level and outputs a signal in response to a result of discrimination. A result of discrimination caused by the discrimination circuit DCD can be outputted only when the test mode is set, i.e. when the control signal $\phi$test is asserted and under the other cases (when the control signal $\phi$test is negated), the output is set to have a high impedance condition. The above transmittance circuit TRS may transmit an input signal to the output terminal when the control signal $\phi$test is negated. In case that the control signal $\phi$test is asserted, this transmittance circuit TRS has its output of high impedance condition. The above data output buffer DOBUF becomes operable when the control signal $\phi$r is asserted, and the data input buffer DIBUF becomes operable when the control signal $\phi$w is asserted.

The above discrimination circuit DCD has an ideal logic in which it may be composed of, as shown in FIG. 1, two-input type exclusive OR circuit EXOR employing an exclusive OR in respect to amplifying levels of the reading common data line pairs RCD and $\overline{RCD}$ and of AND gate circuit AND employing a logical AND of an output of the exclusive OR circuit EXOR and the above control signal $\phi$test. In order to cause an output from the above discriminating circuit DCD to have a high impedance condition when the above control signal $\phi$test is negated, for example, an output node of the above AND gate circuit AND is provided with the transfer gate MOSFET and this may be switch controlled with the above control signal $\phi$test. In other words, the above AND gate circuit AND is constituted by a gate circuit of try state constitution.

When a test mode is set to select the memory cell in a line-by-line basis (one word line) from a memory cell array MCA initialized by the above initializing mode, read out data from the memory cell and discriminate a good or bad state in the memory cell array MCA, the desired word line is driven to the selective level with the address signal ADDRref, all the column selective signals RCS1 to RCSn are driven to the selective level. With this arrangement, the control MOSFET Q4 and Q5 are switched in response to a potential of each of the bit line pairs BL1, BL1 to BLn, $\overline{BLn}$ and each of the potentials of the reading common data line pairs RCD and $\overline{RCD}$ is determined in response to the complementary level of each of the bit line pairs. At this time, the bit line pairs and the reading common data line pairs RCD and $\overline{RCD}$ are not electrically connected under an action of the gate capacity of the control MOSFET Q4 and Q5. So even if all the column selective signals RCS1 to RCSn are driven at a selective level, the complementary reading data level on each of the bit line pairs is not influenced by the levels of the reading common data line pairs RCD and $\overline{RCD}$. Therefore, in case that the reading data of the memory cells connected to the word lines to be selected is coincided with the initializing level, in other words, if these memory cells simultaneously selected are normal, the reading common data line pairs RCD and $\overline{RCD}$ are driven at the complementary level. In turn, in case that the reading data of the memory cells connected to the selected word lines is not coincided with any one of the initializing levels, in other words, if there is any one of abnormal memory cells found in the simultaneously selected memory cells, the reading common data line pairs RCD and $\overline{RCD}$ are discharged to their low levels. The above discrimination circuit DCD detects the coincidence and non-coincidence of the levels as found in the reading common data line pairs RCD and $\overline{RCD}$ through an exclusive OR circuit.

A setting of each of the above operating modes and a formation of various control signals are performed by the control circuit CONT. To this control circuit CONT are supplied $\overline{RAS}$ (row address strobe) signal acting as an external signal, $\overline{CAS}$ (column address strobe) signal and $\overline{WE}$ (write enable) signal. The above $\overline{RAS}$ signal and $\overline{CAS}$ signal are applied as the operation mode setting or a basic signal for generating the inner timing signal. $\overline{WE}$ signal is applied as a signal for indicating the read/write operation. Although not particularly limited, in case that $\overline{RAS}$ signal and $\overline{CAS}$ signal are asserted in this order, a normal access mode such as a read/write mode is applied.

Similarly, as already described in reference to FIGS. 14(a) to (d), in case that $\overline{CAS}$ signal is asserted before $\overline{RAS}$ signal is asserted, it is defined as a special mode setting. In case of the present preferred embodiment, a part of the output of the column address buffer CABUF is supplied to the control circuit COUT, and a CAS before RAS refresh mode, an initialize mode or a test mode are selectively set in response to the output signal (address signal). In case that these special modes are set, it is not necessary to receive an address signal from an external part, and then a required address signal ADDRref is generated in sequence from the refresh counter REFCUNT stored in DRAM. The control circuit CONT may assert/negate the above various control signals under a desired order in accordance with the operation mode set inside.

Operation in the above DRAM will be described in reference to the initialize mode and the test mode in particular.

At first, if the initialize mode is set in DRAM, the column decoder CDEC may set all the writing column selective signals WCS1 to WCS to the selective level substantially in a simultaneous manner to control all the transfer MOSFET Q2 and Q3 under their turned on condition. At this time, all the detecting amplifiers SA1 to SAn are made enable with the above control signal $\phi$sa and under this condition the initialize data, for example, data of logic "1" is supplied from the data input buffer DIBUF to the writing column selective circuit WCSW. With this arrangement, each of the detecting amplifiers SA1 to SAn may latch the initialize data of the logic "1".

Then, the address incrementing operation is instructed by the control signal $\phi$ref. Thus, the address signal ADDRref is generated for selecting one by one the word lines W1 to Wn from the refresh counter REFCUNT in sequence. When the word lines are driven to the selective level in sequence, the initialize data is written into a plurality of memory cells having selective terminals connected to the selected word lines. In this way, all the word lines W1 to Wn contained in the memory cell array MCA are selected in sequence and all the word lines are selected, thereby an initialize operation of the logic "1" for all the memory cells is completed.

When the test mode is set after the above initialize mode, a plurality of memory cells initialized to the logic "1" by the initialize mode are read out in one-by-one line basis (one word line) t enable a good or bad condition of the memory array MCA to be discriminated That is, if the test mode is set, the address incrementing operation is instructed by the control signal $\phi$ref. Thus, an address signal ADDRref is generated for selecting the word lines W1 to Wn from the refresh counter REFCUNT in one-by-one line basis. If the word lines are driven in sequence to the selective level, data is read out to each of the bit line pairs BL1, to BLn, $\overline{BLn}$ from all the memory cells having selective terminals connected to the selected word lines. Thus, each of the detecting amplifiers SA1 to SAn controlled to be operable at this time may amplify a minute potential between the bit line pairs BL1, BLn, $\overline{BLn}$ to drive the bit line pairs to their complementary levels. With this arrangement, the above control MOSFET Q4 and Q5 are complementarily switched. At this time, since to the column decoder CDEC are supplied the asserted control signals $\phi$sp and $\phi$r, the column decoder CDEL makes all the reading column selective signals RCS1 to RCSn in response to these control signals. In this way, all the selective MOSFET Q6 and Q7 are turned on. Therefore, the reading common data line pairs RCD and $\overline{RCD}$ are made to levels corresponding to the complementary level of each of bit line pairs. For example, in case that data of a logic "1" is read out from the memory cell and further in case that the bit line BL1 connected to the gate of the control MOSFET Q4 is in a high level and the bit line BL1 connected to the gate of the control MOSFET Q5 is in a low level, the reading common data line RCD connected to the turned on control MOSFET Q4 is discharged to the row level through the selective MOSFET Q6 and the reading common data line $\overline{RCD}$ connected to the turned off control MOSFET Q5 is maintained at the pre-charge level (Vdd).

At this time, since each of the bit line pairs BL1g, BL1 to BLn, $\overline{BLn}$ and the reading common data line pairs RCD, $\overline{RCD}$ are not directly and electrically conducted under an action of the gate capacitances of the control MOSFET Q4 and Q5, the complementary reading data level on each of the bit line pairs is not influenced by the levels of the reading common data line pairs RCD and $\overline{RCD}$ even if the column selective signals RCS1 to RCSn are all driven to the selective levels. Therefore, in case that the reading data of all the memory cells relating to one desired and selected one word line are coincided with the initialize data "1", in other words, if all the memory cells are normal, the reading common data line pairs RCD and $\overline{RCD}$ are driven to the complementary levels. In turn, in case that any one of the reading out data of the memory cells relating to the selected word line is not coincided with the initialize level "1", in other words, if any one of abnormal memory cells is contained, the reading out common data line pairs RCD and $\overline{RCD}$ are discharged to their row levels together.

Coincidence and non-coincidence of levels as found in the reading out common data line pairs RCD and $\overline{RCD}$ are judged by the exclusive OR circuit EXOR contained in the above discriminating circuit DCD. That is, in case that the reading out common data line pairs RCD and $\overline{RCD}$ are driven to their complementary levels, the output of the exclusive OR circuit EXOR becomes a high level and in case that the reading out common data line pairs RCD and $\overline{RCD}$ are discharged to their low levels together, the exclusive OR circuit EXOR has its output to be a low level. The signal corresponding to this result of discrimination is transmitted to the data output buffer circuit DOBUF through AND gate circuit AND by asserting the control signal $\phi$test to a high level.

In this way, if the word lines are driven in sequence to their selective levels, a good or bad condition of the memory cell having the selective terminals connected to the selected word line is discriminated in a word line unit. With this operation, it is possible to discriminate the good or bad condition of the word line unit in respect to all the memory cells by selecting all the word lines W1 to Wn contained in the memory array MCA.

In the same manner as that of the previous preferred embodiment, to the reading common data lines RCD and $\overline{RCD}$ is connected a pre-charge MOSFET Q12 and a power supply voltage (Vdd) is pre-charged by a pre-charge signal $\phi$pc before testing operation and a reading out operation and the like. Although not illustrated in FIG. 7, a similar pre-charge MOSFET is also arranged in each of the bit lines and a pre-charge of the bit lines is performed before the word lines are selected.

Figure 10:
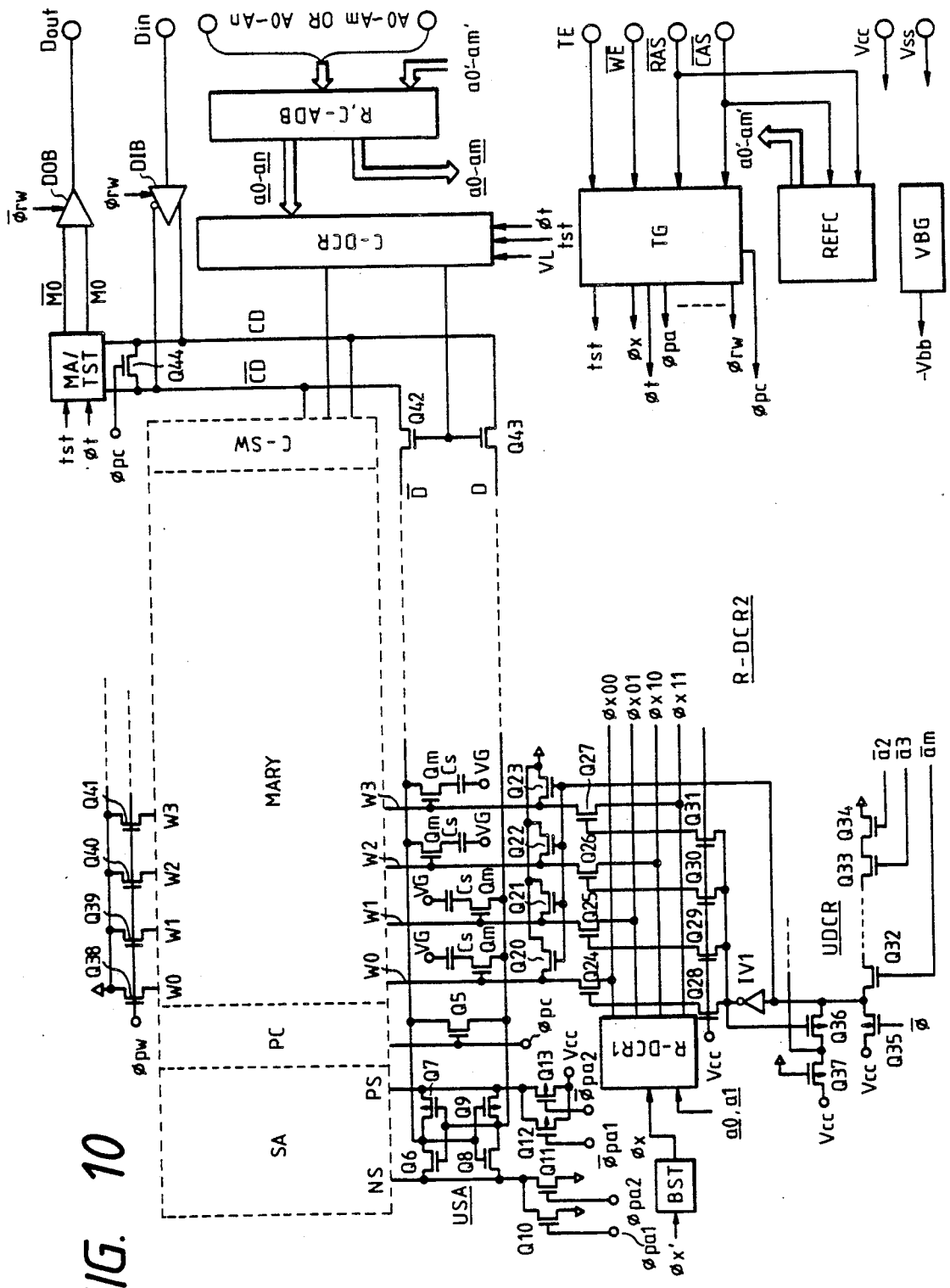
FIG. 10 is a circuit diagram for showing the sixth preferred embodiment of a dynamic RAM of the present invention.

In FIG. 10 is illustrated a schematic circuit diagram of one preferred embodiment of the dynamic RAM of the present invention. Each of the circuit elements in this figure is formed on the semiconductor substrate such as one monocrystalline silicon by a well-known CMOS integrated circuit manufacturing technology. In this figure, MOSFET added with arrows at the channel portions is P-channel type.

Constitution and operation of the dynamic RAM shown in FIG. 10 are substantially the same as those of the dynamic RAM shown in FIG. 1 and the similar constitution and action parts are designated with the same symbols. Due to this fact, in order to facilitate the following description, the portion which is different from that of the dynamic RA of FIG. 1 will be described as follows. In FIGS. 10 and 1, same symbols are applied and the portions not described in the following description will be referred to the description relating to FIG. 1 and the related previous description.

In the preferred embodiment of the present invention, it is constructed such that a reset pulse $\phi$pw is supplied to the gates of a resetting N-channel MOSFET Q38 to Q41 arranged at a far end (an opposite end to the decoder side) of the word lines. These MOSFET Q38 to Q41 are turned on by the common reset pulse $\phi$pw, thereby the selected word lines are reset to the ground level at both ends thereof in the same manner as that of the dynamic RAM shown in FIG. 1.

The column decoder C-DCR is composed of basically an address decoder circuit which is similar to the row address decoder R-DCR (see the description relating to FIG. 1), may interpret the complementary address signals a0 to an supplied from the column address buffer C-ADB and form the selective signal to be supplied to the above column switch C-SW in synchronism with the selective timing signal $\phi$t in the data line. In particular, in the preferred embodiment, in order to realize a high speed reading test, the column decoder C-DCR receives both test signal test and a constant voltage VL set to a potential lower than a high level in the circuit. Although not particularly limited, a multiple selective operating function is added in which all the complementary data lines in the memory array are connected to the common data lines CD and $\overline{CD}$.

In this figure, in the same manner as that shown in FIG. 1, a row address buffer R-ADB and a column address buffer C-ADB are expressed together to designate the address buffers R, C-ADB.

Between the above common complementary data lines CD and $\overline{CD}$ is arranged a N-channel type pre-charged MOSFET Q44 forming a pre-charge circuit which is similar to the pre-charge circuit described in reference to FIG. 1. To the common complementary data lines CD and $\overline{CD}$ are connected a pair of I/O nodes of a main amplifier MA having the same circuit constitution as that of a unit detecting amplifier USA which is described in detail in reference to FIG. 1. Although not particularly limited, the above common complementary data lines CD and $\overline{CD}$ are also connected to the input terminal of the test circuit TST. In this figure, the above main amplifier MA and the test circuit TST are expressed as the same circuit block MA/TST. Common output node $\overline{MOMO}$ of the circuit block MA/TST are connected to an external terminal Dout through the data output buffer DOB. If a normal reading operation is carried out, the data output buffer DOB is made operative with its timing signal $\phi$rw, amplifies an output signal of the main amplifier MA and then transmits it from the external terminal Dout. In turn, if its test mode to be described later, the above test circuit TST is made operative and a result of good or bad condition is outputted from the external terminal through the data output buffer DOB. If a writing operation is carried out under a normal operating mode, the output (Dout) of the data output buffer DOB is made to have its high impedance condition. If the operation is a writing operation under the normal operating mode, the output (Dout) of the data output buffer DOB is kept at its high impedance state with the above timing signal $\phi$rw.

The above common complementary data lines CD and $\overline{CD}$ have an output terminal of the data input buffer DIB connected thereto. If the operation is a writing operation, the data input buffer DIB is made operative with its timing signal $\phi$rw and the complementary writing signal corresponding to the writing signal supplied from the external terminal Din is transmitted to the above common complementary data lines CD and $\overline{CD}$. With this operation, the writing into the selected memory cell is carried out. If the operation is a reading out operation, an output of the data input buffer DIB is made to have a high impedance condition with the above timing signal $\phi$rw. In order to correspond to the reading test to be described later, although not particularly limited, the above data input buffer DIB is set to have a high current driving capability capable of driving a plurality of complementary data lines in the same manner as that described in reference to the preferred embodiment shown in FIG. 1. That is, there is added a function in which the complementary data lines are multiply selected to enable the same writing signal to be simultaneously written into an entire memory cell connected to one word line connected to one word line. As regards details of such simultaneous writing function, it is possible to utilize the described in reference to FIG. 1.

Various timing signals for operating the dynamic type RAM of the preferred embodiment are formed by a subsequent timing signal generating circuit. The timing signal generating circuit TG shown in this figure may form a major timing signal etc. shown as a representative one. This timing signal generating circuit TG which is different from the timing signal generating circuit described in reference to FIG. 1, receives the address strobe signals $\overline{RAS}$ and $\overline{CAS}$ supplied from the external terminal and the write enable signal $\overline{WE}$ and the test signal TS and forms various timing pulses illustrated in the figure. The timing signal generating circuit TG judges the test mode when the test signal TE to be impressed to the testing external terminal is in a high level, and then makes the above main amplifier MA non-operative and the test circuit TST operative. The column decoder C-DCR may supply a level corresponding to a constant voltage VL to all the plurality of MOSFETs constituting a column switch of the memory array MARY in response to an internal test signal tst and make all the column switches selective state. That is, to the gate of MOSFET constituting the column switch is supplied a level corresponding to the constant voltage VL. When the test mode is specified, the timing signal generating circuit TG may form the internal test signal tst and the high level timing signal $\phi t$ in response to the specified test mode.

A circuit designated by a circuit symbol REFC is an automatic refresh circuit and includes a refresh address counter and the like. Although not particularly limited, this automatic refresh circuit REFC judges it as a refresh mode when the row address strobe signal $\overline{RAS}$ is made to have a low level by a logic circuit receiving the address strobe signals $\overline{RAS}$ and $\overline{CAS}$ before the row address strobe signal $\overline{RAS}$ is made as a low level, forms the refresh address signals a0' to am' by the address counter circuit having the above row address strobe signal $\overline{RAS}$ as a clock and then transmits them. The refresh address signals a0' to am' are transmitted to the row address decoder circuits R-DCR1 and R-DCR2 through the above row address buffer R-ADB having a multiplexer function. Due to this fact, the refresh control circuit REFC may generate the control signal for changing over the above address buffer R-ADB in such a way as the complementary address signals corresponding to the above refresh address signals a0' to am' may be outputted from the above address buffer R-AD (not shown). With this arrangement, one word line corresponding to the refresh address signals a0' to am' is selected from a plurality of word lines within the memory array MARY and then the refresh operation is carried out ($\overline{CAS}$ before $\overline{RAS}$ refresh).

Although the preferred embodiment shown in FIG. 10 has no MOSFET Q45 and Q46 described in reference to FIG. 1 and no half voltage HVC (Vcc/2), it may also be apparent that they may be provided in order to make a stable operation.

Figure 11:
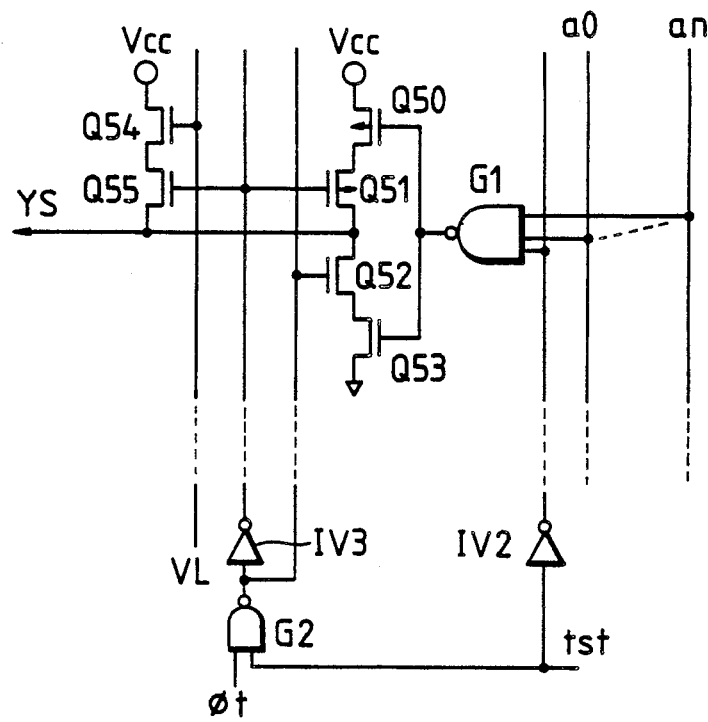
FIG. 11 is a circuit diagram for showing one example of a column address decoder of the sixth preferred embodiment.

In FIG. 11 is illustrated a circuit diagram of one preferred embodiment of the above column decoder C-DCR. The column decoder C-DCR is constituted by a plurality of unit circuits. In this figure is illustrated a circuit diagram of one preferred embodiment of one of these unit circuits.

The column switch C-SW is constituted by a plurality of pairs of column switches MOSFETs. Thus, a pair of column switches MOSFET (for example, Q42 and Q43 of FIG. 10) can be assumed as a unit column switch circuit. In this preferred embodiment, the column decoder portion corresponding to this unit column switch circuit is assumed as the above unit circuit.

The unit column decoder C-DCR corresponding to a pair of column switch MOSFETs (unit column switch circuit) is composed of the following circuits.

Although not particularly limited, the NAND gate circuit G1 has a function to receive the internal address signals a0 to an supplied from the address buffer C-ADB and select one column switch selecting line YS corresponding to the internal address signals and another function to select the above column switch selective line YS corresponding to the above inner address signals a0 to an without having any relation with these addresses. That is, when the inner test signal tst is made to have a high level (Logical "1"), an output signal of the inverter circuit IV2 becomes a low level (Logical "0") and causes an interpreting action for the above address signals a0 to an to be non-effective. With this arrangement, an output signal from the above gate circuit G1 is made to have a high level under a test mode.

The output signal from the above gate circuit G1 is supplied to the gates of P-channel MOSFET Q50 and N-channel MOSFET Q53. Between these MOSFET Q50 and Q53 are connected P-channel MOSFET Q51 and N-channel MOSFET Q52 in series together. To the gate of the above N-channel MOSFET Q52 is supplied an output signal from the NAND gate circuit G2 receiving the above inner test signal tst and the timing signal $\phi t$. To the gate of the above MOSFET Q51 is supplied an output signal of the inverter circuit IV3 receiving an output signal of the above gate circuit G2. Between the above column selective line YS and the power supply voltage Vcc are arranged N-channel MOSFET Q54 and Q55 connected in series to each other. The gate of the above MOSFET Q55 is made in common with the gate of the above P-channel MOSFET Q51 and an output signal of the above inverter circuit IV3 is supplied. To the gate of the other MOSFET Q54 is supplied a desired constant voltage VL set to a lower potential as compared with a high level of the power supply voltage Vcc.

Other unit circuits not shown for constituting the above column decoder C-DCR may also be made in the same structure as that described above. That is, each of the above constant voltage VL, an output signal of NAND gate circuit G2 and the output signals of the inverter circuit IV3 and the inverter circuit IV2 is commonly supplied to each of the gates of the corresponding MOSFET in other unit circuit not shown. Provided that each of the combinations of inner address signals a0 to an supplied to the gate circuit corresponding to the above NAND gate circuit G1 is different to each other. In order to recue a load in the inverter circuit IV2 or IV3 and NAND gate circuit G2, the similar inverter circuits IV2, IV3 and NAND gate circuit G3 may be arranged.

In this preferred embodiment, under a test mode, the internal test signal tst is made to have a high level. With this arrangement, the operation of the above NAND gate circuit G1 is made substantially non-effective and its output signal is fixed to its high level. Therefore, P-channel MOSFET Q50 receiving an output signal of NAND gate circuit G1 is turned off and N-channel MOSFET Q53 is also turned on. When the timing signal $\phi t$ is made to have a high level due to a high level of the above test signal tst, an output signal of the NAND gate circuit G2 is made to have a low level. With this arrangement, the N-channel MOSFET Q52 is turned off and at the same time P-channel MOSFET Q51 is also turned off by the high level output signal of the inverter circuit IV3. Therefore, the circuit arranged at the output side of the above NAND gate circuit G1 is made to have an output of high impedance. At this time, since N-channel MOSFET Q55 is turned on by a high level of the output signal of the above inverter circuit IV3, a level of the column switch selective line YS is defined by MOSFET Q54 and Q55. Since the gate of MOSFET Q54 is supplied with a relative low constant voltage VL as compared with the power supply voltage Vcc, the level of the above column switch selective line YS becomes VL−Vth (Vth is a threshold voltage of MOSFET Q54).

Figure 12:
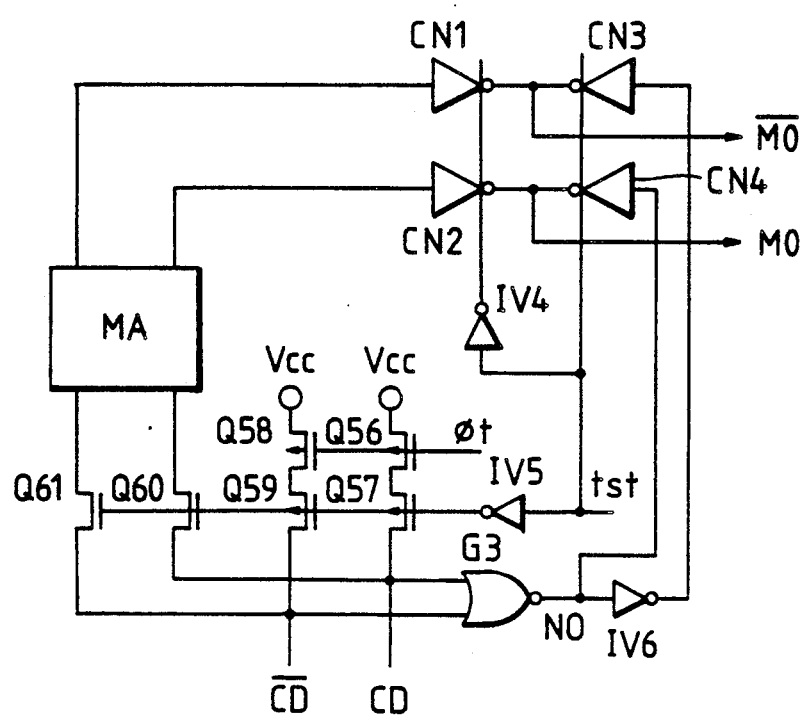
FIG. 12 is a circuit diagram for showing one example of a test circuit of the sixth preferred embodiment.

In FIG. 12 is illustrated a circuit diagram of one preferred embodiment of the above test circuit TST.

The common complementary data lines CD and $\overline{CD}$ are connected on one hand to the input terminal of the main amplifier MA indicated by a black box through N-channel MOSFET Q60 and Q61. To the common complementary data lines Cd and $\overline{CD}$ are connected the pull-up (pre-charge) P-channel MOSFET Q56 and Q58 through P-channel MOSFET Q57 and Q59 on the other hand. Each of the gates of the above P-channel MOSFET Q57 and Q59 and N-channel MOSFET Q60 and Q61 is commonly connected to each other and the inner test signal tst through the inverter circuit IV5 is supplied to the gate of the above common connector. Therefore, under a test mode where the test signal tst is set to a high level, the above P-channel MOSFET Q57 and Q59 are turned on and N-channel MOSFET Q60 and Q61 are turned off and then the test circuit TST is connected to the common complementary data lines CD and $\overline{CD}$.

The above common complementary data lines CD and $\overline{CD}$ are, although not particularly limited, connected to the input terminal of NOR gate circuit G3. This NOR gate circuit G3 may constitute a good/bad condition discriminating circuit. An output signal NO of this NOR gate circuit G3 and its inverted signal passed through the inverter circuit IV6 are transmitted to input terminals of clocked inverter circuits CN4 and CN3 operating as a multiplexer circuit.

A pair of complementary output signals of the above main amplifier MA are transmitted to the input terminals of the clocked inverter circuits CN1 and CN2 operating as the above multiplexer. Output terminals of the above clocked inverter circuits CN1, CN3 and CN2, CN4 are made as a common terminal, respectively, and transmitted to the input terminal of the data output buffer DOB (not shown) as a pair of complementary output signals MO and $\overline{MO}$.

The above clocked inverter circuits CN3 and CN4 have their clock terminals supplied with the test signal tst. With this operation, the clocked inverter circuits CN3 and CN4 are made operative under a test mode where the test signal tst is made to have a high level. To the clock terminals of the other clocked inverter circuits CN1 and CN2 is supplied the above test signal tst while being inverted through the inverter circuit IV4. Therefore, during the test mode where the above test signal tst is made to have a high level, the above clocked inverter circuits CN1 and CN2 are made inoperative and shows an output high impedance condition. With this arrangement, during the test mode, an output signal of the above NOR gate circuit G3 is outputted from the external terminal Dout through the data output buffer DOB. In turn, under a normal operating mode where the above test signal tst is made to have a low level, to the common complementary data lines Cd and $\overline{CD}$ is connected the main amplifier MA, thereby the clocked inverter circuits CN1 and CN2 are made operative and the clocked inverter circuits CN3 and CN4 corresponding to the test circuit TST are made inoperative, so that the reading out signal is outputted from the external terminal Dout through the data output buffer DOB.

A general reading test operation of the dynamic RAM shown in FIGS. 10, 11 and 12 will be described in reference to the operative waveform diagram shown in FIG. 4.

Prior to the reading-out test under the above test mode, the same stored information is written in advance in the memory cell in the memory cell array M-ARY in FIG. 10. For example, when the high level signal (a logic "1") is being written in the memory cell connected to the non-inverted complementary data line D, a low level (a logic "0") is being written in the memory cell connected to the inverted complementary data line $\overline{D}$. The stored high level and low level information in the above complementary data lines D and $\overline{D}$ are corresponded to the same signal of logical "1" in view of the writing/reading information from the external terminals Din and Dout. That is, in any one of the cases, it may correspond to the same logic "1" in view of the external terminal. Such a same writing of the stored information may be performed in one bit unit. Of course, if the above data input buffer DIB is added with a function to enable a simultaneous writing to the memory cell of one word line described above, it may be utilized. In case that such a simultaneous writing function is to be added, the column decoder C-DCR is added with a simultaneous selective function having a part of the circuit shown in FIG. 11 modified (that is, a plurality of column selective signals are selected simultaneously so as to cause a plurality of complementary data lines to be connected simultaneously to the common complementary data lines).

Although eliminated in FIGS. 13(a) to 13(d), the row address strobe signal $\overline{RAS}$ is varied from its high level to its low level, the address signal corresponding to the word line to be selected is supplied and one word line selecting operation is carried out. Then, the stored information from the selected memory cell is amplified by activating the detecting amplifier SA. In this figure are illustrated a level of signal read out of the memory cell and another level of a signal got through an amplifying operation of the detecting amplifier SA in response to the two complementary data lines D0, $\overline{D0}$, D1 and $\overline{D1}$.

For example, in case that signals read out at the complementary data lines D1 and $\overline{D1}$ are wrong, they show such a level as opposite to the levels of the above complementary data lines D0 and $\overline{D0}$ indicated as a representing one in this figure and to which the correct reading operation is carried out In the circuit diagram shown in FIG. 12, the potentials in the common complementary data lines CD and $\overline{CD}$ are charged up to their high level, respectively under the test mode. Therefore, if the column switch selective line YS has a low level such as VL-Vth, the gate of the column switch MOSFET connected to the inverted complementary data line $\overline{D0}$ etc. made to have a low level such as the ground potential of the circuit under a amplifying operation of the detecting amplifier SA is turned on due to a supplying of the above level of VL-Vth and then the inverted common complementary data line $\overline{CD}$ is pulled to the low level. Since there are many complementary data lines arranged in the memory array MARY which are correctly read, the pulling of the low level of the above inverted common complementary data line $\overline{CD}$ is carried out at a high speed. In response to a decreasing in potential of the inverted common complementary data line $\overline{CD}$, the column switch MOSFET corresponding to the inverted complementary data line $\overline{D1}$ erroneously read out as a high level is also turned on and the potential of the inverted complementary data line $\overline{D1}$. The level of the inverted complementary data line $\overline{D1}$ is determined by a ratio between the conductance of the column switch MOSFET and the sensed up conductance.

In turn, the non-inverted complementary data line D1 of which reading is erroneously performed shows a low level, its corresponding column switch MOSFET is also turned on in the same manner as above and then the non-inverted common complementary data line CD is also pulled to the low level. At this time, since the gate of the column switch MOSFET is set to its low potential such as the above VL-Vth, the level of the above non-inverted complementary data line CD is merely decreased down to the potential of VL-2Vth. That is, since the other non-inverted complementary data line D0 etc. are set at a high level such as a power supply voltage Vcc, if the above non-inverted complementary data line D1 has a potential lower than VL-2Vth, its corresponding column switch MOSFET is weakly turned on and the potential of the above non-inverted complementary data line D1 is pulled up.

That is the gate voltage of the above column switch MOSFET is set to the low potential VL-Vth to cause only the reading out signal of a pair of complementary data lines to be erroneous. In this case, the potential in the complementary data line can be prevented from being inverted by all the potentials of the complementary data lines. In other words, the erroneous read-out signal can be prevented from being corrected under a common connection of all the complementary data lines.

The level of the above common complementary data line CD (VL-Vth) is deemed as a low level by the threshold voltage of the NO gate circuit G3 in FIG. 12 and if there is only one erroneous memory cell as described above, an output signal of the NOR gate circuit G3 becomes a logic "1". With this arrangement, in case that there is an erroneous reading-out bit as described above, a signal of logical "0" is outputted from the output terminal Dout. If all the reading-out signals of all the memory cells connected to one word line are coincided to each other, the common complementary data lines CD and $\overline{CD}$ are a combination of a high level and a low level, so that an output signal of the above NOR gate circuit G3 becomes a logical "0" and a logical "1" is outputted from the output terminal Dout.

It is possible to detect a presence of the above erroneous bit by short circuiting merely the intercomplementary data lines without arranging the above test circuit TST. For example, in case of applying the MOS detecting amplifier shown in FIG. 10, or in case of arranging the active list circuit, a presence of one bit causes a DC current to be flowed between the detecting amplifiers or to the active restoring circuit through the column switch circuit. That is, in case of the above-described example, a passing-through current is flowed between the detecting amplifier connected to the complementary data lines D1 and $\overline{D1}$ and the detecting amplifier connected to another complementary data line having as its representing one the complementary data lines D0 and $\overline{D0}$. In reference to this fact, a sensing of the power supply current in RAM enables the good/bad condition to be discriminated.

Actions and effects got through the preferred embodiments shown in FIGS. 1 to 6 are as follows.

(1) They have an effect that there is provided MOSFET having a signal of complementary data line to which the memory cell is connected supplied to the gate, there is provided a circuit for outputting the coincidence/non-coincidence of the levels in the corresponding complementary data lines on the basis of the drain output signal of the about MOSFET, and the same information is stored in advance to enable the information in the corresponding complementary data line to generate the same reading signal, so that in case of a presence of the memory cell storing only one erroneous information therein, it may be detected by the above coincidence/non-coincidence circuit to enable a high speed testing operation to be performed.

(2) There is employed a constitution in which as the above MOSFET, the units corresponding to the inverted and non-inverted complementary data lines are connected in parallel to each other, it has an effect capable of discriminating a presence or non-presence of a high speed reading error.

(3) By employing the constitution in which the units corresponding to the non-inverted and inverted complementary data lines are connected in series as the above MOSFET, it has an effect capable of constituting the test circuit in a high density.

(4) As the above MOSFET, its source is connected to its reference potential point, its drain output is connected to the reading common complementary data line through the reading column switch MOSFET, and at the same time the above column switches corresponding to a plurality of complementary data lines under a reading test mode are simultaneously turned on. With this arrangement, under the normal reading mode, a selecting timing of the column switch can be made fast and a high speed reading can be carried out due to an amplifying operation of the above MOSFET. In addition, it has another effect that under a high speed reading test mode, the above MOSFET is turned on/turned off in response to the level of the complementary data line, resulting in that a high-speed reading test can be performed in the same manner as above.

(5) RAM is composed of a plurality of memory arrays, a drain output from the above MOSFET is made substantially effective for the one corresponding to the memory array where the selected word line is present, thereby a high-speed reading test for a plurality of memory arrays can be carried out simultaneously and so a high-speed reading test for RAM having a high memory capacity is enabled. For example, the memory array is divided into 16 segments, and four word lines of the memory arrays are selected to enable a reading test for all the bits of RAM having a high memory capacity of about 4M bits to be completed only in 1024 cycles. According to the preferred embodiment shown in FIGS. 7 and 8 the following actions and effects can be attained.

(6) In a testing system in which the data of the same level is written in advance in all the memory cells, the memory cells are initialized, thereafter the data is read out of the initialized memory cells to discriminate the good or bad condition of the memory cells, all the column selective signals RCS1 to RCSn are driven to the selective level for every selection of the word lines, the levels of the reading common data line pairs RCD and $\overline{RCD}$ are enforced in response to the complementary level of each of the bit line pairs BL1, $\overline{BL1}$ to BLn, $\overline{BLn}$.

At this time, since each of the bit line pairs and the reading common data line pairs RCD and $\overline{\text{RCD}}$ are not directly and electrically conducted under an action of the gate capacity of the control MOSFET Q4 and Q5, even if the column selective signals RCS1 to RCSn are driven to the selective level, the complementary reading data level on each of the bit line pairs is not influenced by the levels of the reading common data line pairs RCD and $\overline{\text{RCD}}$. Therefore, although the levels of the reading common data line pairs RCD and $\overline{\text{RCD}}$ are deemed as the complementary levels corresponding to the initializing level if poor memory cell is not contained, if the poor memory cells are contained, their differences are discriminated by the discriminating circuit DCD, thereby all the memory cells connected to the word lines under one word selective operation can be discriminated for their good or bad conditions of all the memory cells. So, a testing efficiency for discriminating the good or bad condition of the memory cell can be improved.

(7) Under the above described actions and effects, the discrimination of good or bad condition of the memory cells can be carried out in a word line unit and the result of discrimination can be utilized for selecting a surplus word line selection in case of DRAM having the surplus constitution.

(8) Since there are gate capacities of the control MOSFET Q4 and Q5 between the bit line pairs and the reading common data lines RCD and $\overline{\text{RCD}}$, the reading common data line pairs RCD and $\overline{\text{RCD}}$ do not constitute non-desired load for the bit line pairs. Due to this fact, even if the selective MOSFET Q6 and Q7 are controlled to be turned on before a specifying time of the amplifying operation by the detecting amplifiers SA1 to SAn, no non-desired noise is given from the reading common data line pairs RCD and $\overline{\text{RCD}}$ to the detecting amplifier and so a high speed reading operation in a normal access mode can be contributed.

Actions and effects obtained from the preferred embodiment shown in FIGS. 10 to 13 are as follows.

(9) Since the complementary data lines to which the memory cells having the same information stored in advance are connected to each other by arranging a circuit for short circuiting a plurality of complementary data lines to which the memory cells are connected after the detecting amplifier is started to operate under a specifying of the test mode, if there is only one memory cell storing erroneous information, a passing-through current flows between the CMOS detecting amplifiers for amplifying the reading signal in the complementary data line or in the active restoring circuit, the passing-through current is measured or an equal signal level in the common data lines to which the above complementary data lines are connected is detected, thereby multi-bit reading test can be performed. With this arrangement, it has an effect capable of performing the high-speed reading test. For example, in the constitution in which the complementary data lines are short circuited in a word line unit, if the memory capacity is N-bits, all the reading tests are completed in a test cycle of $N^{\frac{1}{2}}$ times.

(10) With a simple constitution in which the column switches are utilized to cause a short-circuit between the complementary data lines to be carried out and to modify the output part of the column decoder, it has an effect capable of performing a high-speed reading test.

(11) With the above effect (10), it has another effect to enable a chip size of RAM having a high-speed reading test function to be small-sized.

The present invention has been described above in reference to the preferred embodiments more practically, it is apparent to say that the present invention is not limited to the above preferred embodiments and it may be modified variously within a range not departing from the scope of the present invention. For example, the detecting amplifier may be formed as one in which in addition to CMOS circuit, MOSFET of which gates and drains are cross connected is made as a unit circuit. In this case, the complementary data lines are provided with the active restoring circuit. The reading-out reference voltage of the memory cells may be one, in addition to the application of the half pre-charge voltage as above, in which a reference voltage is formed with a dummy cell. An address signal may be one in which it may be supplied from each of the independent external terminals from the row and column. In this way, a practical constitution of each of the circuits constituting the dynamic RAM can be made in various forms. The practical constitution of the coincidence/non-coincidence circuit may be any constitution in which an output signal is formed in response to the coincidence/non-coincidence of both signals.

In the present invention, a similar high-speed reading test can be performed by adding the same MOSFET even in the static RAM in addition to the dynamic RAM due to the fact that the memory cells are connected to a pair of complementary data lines.

The circuit for short circuiting the complementary data lines in order to perform a reading test may be one in which the short-circuiting switch MOSFET is utilized in addition to providing the column switches and the column decoders. Even in this case, a mere application of a pair of switches is satisfactory and so a simple constitution can be attained under an arrangement of array of the switches.

For example, in the above preferred embodiments, it has been described for the RAM in which the data input/output is performed against the external unit in one bit unit, but the present invention is not limited to this arrangement, and it is also possible to divide the memory array into a plurality of mats and to perform an input/output operation for the date. In this case, the exclusive OR circuits contained in the discriminating circuit are arranged in each of the mats, further exclusive OR is applied for each of the outputs to output the result.

In the preferred embodiment shown in FIG. 7, an input signal of the exclusive OR circuit EXOR is amplified separately by the main amplifier in response to the test mode setting. In view of a theoretical point, the signal level of the common data line pairs can be supplied as it is. In case that the signal level of the common data line paris is amplified to apply it to the discriminating circuit, as found in the previous preferred embodiment, it is not limited to the case in which the main amplifier capable of getting the amplified output of same phase level in response to the time when the levels of the reading common data line pairs are made to show the same phase level, but an amplifier different from the main amplifier may be used. Further, the discriminating means for discriminating the coincidence/non coincidence of the levels in the common data line pairs is not limited to the constitution employing the exclusive OR but other constitutions including the exclusive NOR circuit can be applied.

Figure 9:
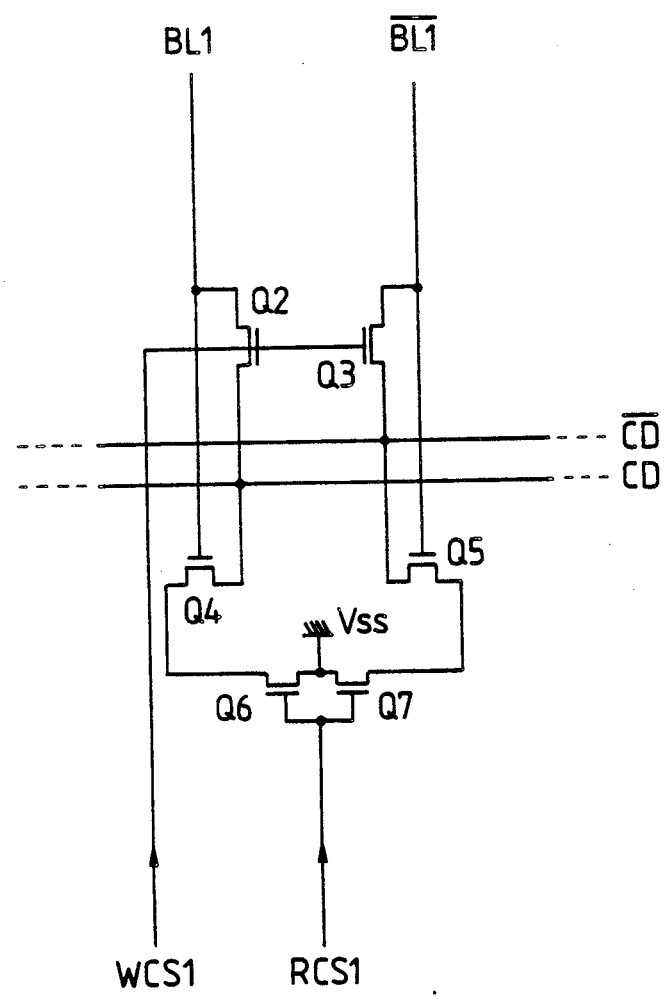
FIG. 9 is a circuit diagram for showing another example of a reading selective switch circuit of the fifth preferred embodiment.

In the preferred embodiment shown in FIG. 1, the writing common data line pairs and reading data line pairs are separately arranged to each other, but the present invention may not be limited to them. As shown in FIG. 9, each of the above transfer MOSFET Q2, Q3 and the control MOSFET Q4 and Q5 may commonly be connected to each other. In addition, the second switch element such as the selective MOSFET Q6 and Q7 described in reference to the preferred embodiment shown in FIGS. 7 and 8 may be constituted by an element such as one N-channel MOSFET etc. In this case, the source electrodes of the control MOSFET Q4 and Q5 in the previous preferred embodiment are commonly connected to the drain electrode of the one N-channel MOSFET.

Initializing data required for performing a testing operation is not necessarily made same in all the memory cells, but it is satisfactory if the same level is applied for all the selected memory cells.

In the previous description, mainly the invention made by the present inventor is applied to the case of its field of DRAM of its background, but the present invention is not limited to it and it may be applied to various semiconductor type memory devices. The present invention may be applied to at least one in which the testing operation is performed under a full selection of all the memory cells.

Effects attained by the representative system of the present invention disclosed herein will be described in brief as follows.

MOSFET is provided in which signals in the complementary data lines to which the memory cells are connected are supplied to the gates, there is provided a circuit for outputting the coincidence/non-coincidence of the levels of the corresponding complementary data lines on the basis of the drain output signals of the MOSFET, the same information is stored in advance in the memory cells, thereby the corresponding complementary data lines may get the same reading signals, so that in case that there is only one memory cell storing one erroneous information, the coincidence/non-coincidence circuit can not detect it, so a high-speed reading test can be carried out.

The reading selective switch circuit which is composed by connecting a plurality of bit line paris to which the data input/output terminals of the memory cells are connected does not transmit the level of the common data line pairs to each of the bit line pairs irrespective of its switching operation, so that it has an effect to improve a testing efficiency for a discrimination of good or bad condition of the memory cell by a method wherein the common data line pairs are forced in their levels by a plurality of memory cells such as word line units initialized to the desired level, thus the good or bad condition of a plurality of memory cells can be discriminated on the basis of the coincidence/non-coincidence of the levels of the common data line pairs attained thereby.

Since there is a memory cell for storing even one erroneous information due to the fact that the complementary data lines to which the memory cells having the same information stored in advance are connected to each other after a plurality of complementary data lines to which the memory cells are connected are started to perform the detecting operation by specifying the test mode, a passing-through current is flowed between the CMOS detecting amplifiers for amplifying the reading-out signals of the complementary data lines or in the active restoring circuit, the passing-through current is measured or the equal signal levels in the common complementary data lines to which the complementary data lines are connected is detected to enable the multi-bit reading test to be carried out.

What is claimed is:

1. A semiconductor memory device comprising:
   a plurality of data lines;
   a plurality of memory cells provided corresponding to each data line;
   a common data line coupled in common to the plurality of data lines;
   a main amplifier coupled between the common data line and a data output terminal; and
   detecting means coupled to the plurality of data lines,
   wherein the detecting means includes a plurality of MOSFETs each having a gate connected to a respective data line, and wherein said detecting means further includes a logic circuit for determining whether the data lines are substantially equal in potential.

2. A semiconductor memory device according to claim 1, wherein the MOSFETs are coupled in parallel to one another.

3. A semiconductor memory device according to claim 1, wherein the MOSFETs are connected in series to one another.

4. A semiconductor memory device according to claim 1, further comprising:
   means for storing the same information in said plurality of memory cells; and
   means for reading out the information in said plurality of memory cells onto said data lines so that the potential of each of said data lines is equal to a predetermined potential,
   whereby said detecting means can detect a defective memory cell by determining when one of said data lines is not equal to said predetermined potential.

5. A semiconductor memory device according to claim 4, wherein said reading out means includes means for simultaneously reading out the stored information in said plurality of memory cells.

6. A semiconductor memory device comprising:
   a plurality of data lines;
   a plurality of memory cells provided corresponding to each data line;
   a common data line coupled to the plurality of data lines through MOSFETs having gates connected to the data lines, respectively;
   a main amplifier coupled between the common data line and a data output terminal;
   a plurality of switch means for selectively transmitting information between the data lines and the common data line; and
   control means coupled to said switch means for turning ON one or more of said switch means, wherein the control means includes means to turn ON predetermined one of the switch means in an ordinary read mode and to turn ON a plurality of said switch means in a test read mode.

7. A semiconductor memory device according to claim 6, wherein the plurality of switch means is coupled between each of the MOSFETs and the common data line, respectively.

8. A semiconductor memory device according to claim 6, wherein the plurality of switch means is coupled between each of the MOSFETs and a power supply voltage.

9. A semiconductor memory device comprising:
a plurality of data lines, each of which is coupled with a memory cell and each of which has a first and second end;
a common data line coupled with a first end of each of said data lines;
a plurality of switch means, each of which is respectively coupled between said first end of one of said data lines and the common data line; and
control means coupled to said switch means for turning ON one or more of the switch means, wherein said control means includes means to turn ON a predetermined one of the switch means in an ordinary read mode and means to turn ON a plurality of the switch means in a test read mode.

10. A semiconductor memory device comprising:
a plurality of data line pairs;
memory cells provided corresponding to each data line pair;
a common data line pair connected in common to said plurality of data line pairs;
switch means respectively coupled between said plurality of data line pairs and said common data line pair; and
control means coupled to said switch means for turning ON one or more of said switch means, wherein said control means includes means to turn ON a predetermined one of said switch means in an ordinary read mode and to turn ON a plurality of said switch means in a test read mode.

11. A semiconductor memory device according to claim 10, further comprising:
means for storing the same information in said plurality of memory cells; and
means for reading out the information in said plurality of memory cells to said common data line pair during said test read mode so that the potential of one common data line of said common data line pair goes to a predetermined high potential level and the potential of the other common data line of said common data line pair goes to a predetermined low potential level; and
means of detecting a defective memory cell by determining that the potential on both of said common data lines of said common data line pairs is the same.

12. A semiconductor memory device according to claim 11, wherein said reading out means includes means for simultaneously reading out the stored information in said plurality of memory cells.

* * * * *